US012575158B2

(12) United States Patent
Huang

(10) Patent No.: US 12,575,158 B2
(45) Date of Patent: Mar. 10, 2026

(54) SEMICONDUCTOR DEVICE INCLUDING MULTIPLE SPACERS AND A METHOD FOR PREPARING THE SAME

(71) Applicant: NANYA TECHNOLOGY CORPORATION, New Taipei City (TW)

(72) Inventor: Chung-Lin Huang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 617 days.

(21) Appl. No.: 18/103,644

(22) Filed: Jan. 31, 2023

(65) Prior Publication Data

US 2024/0258404 A1 Aug. 1, 2024

(51) Int. Cl.
| | |
|---|---|
| *H10D 64/01* | (2025.01) |
| *H01L 23/528* | (2006.01) |
| *H10D 30/01* | (2025.01) |
| *H10D 30/60* | (2025.01) |
| *H10W 20/41* | (2026.01) |

(52) U.S. Cl.
CPC ....... *H10D 64/021* (2025.01); *H10D 30/0227* (2025.01); *H10D 30/601* (2025.01); *H10W 20/435* (2026.01)

(58) Field of Classification Search
CPC . H10D 64/021; H10D 30/0227; H10D 30/601
See application file for complete search history.

(56) References Cited

U.S. PATENT DOCUMENTS

| | | | | |
|---|---|---|---|---|
| 618,472 | A | 1/1899 | Laing | |
| 6,040,238 | A * | 3/2000 | Yang | H10D 30/0227 |
| | | | | 438/491 |
| 9,548,366 | B1 * | 1/2017 | Ho | H10D 84/0149 |
| 2006/0145253 | A1 * | 7/2006 | Lee | H10D 64/021 |
| | | | | 438/303 |
| 2020/0066878 | A1 | 2/2020 | Huang | |
| 2020/0135887 | A1 * | 4/2020 | Wu | H10D 84/853 |
| 2022/0077152 | A1 * | 3/2022 | Lim | H10D 30/611 |
| 2024/0008264 | A1 * | 1/2024 | Huang | H10B 12/50 |

FOREIGN PATENT DOCUMENTS

| | | |
|---|---|---|
| TW | 201203462 A | 1/2012 |
| TW | 201724282 A | 7/2017 |
| TW | 202129920 A | 8/2021 |

(Continued)

OTHER PUBLICATIONS

Office Action and and the search report mailed on Dec. 12, 2023 related to Taiwanese Application No. 112119662.

(Continued)

*Primary Examiner* — Sue A Purvis
*Assistant Examiner* — Jason James Greaving
(74) *Attorney, Agent, or Firm* — Xuan Zhang

(57) ABSTRACT
A semiconductor device and a method for preparing the same are provided. The semiconductor device includes a substrate, a gate electrode, a first spacer, and a second spacer. The gate electrode is disposed on the substrate. The first spacer is disposed on a sidewall of the gate electrode. The second spacer covers the first spacer. The first spacer includes dopants.

16 Claims, 25 Drawing Sheets

(56)                    References Cited

FOREIGN PATENT DOCUMENTS

| TW | 202232760 A | 8/2022 |
|----|-------------|--------|
| TW | 202247464 A | 12/2022 |

OTHER PUBLICATIONS

Office Action and and the search report mailed on Feb. 17, 2025 related to Taiwanese Application No. 113104443.
Summary translation of Office Action and and the search report mailed on Feb. 17, 2025 related to Taiwanese Application No. 113104443.
Office Action and and the search report mailed on Oct. 29, 2024 related to Taiwanese Application No. 113104443.

* cited by examiner

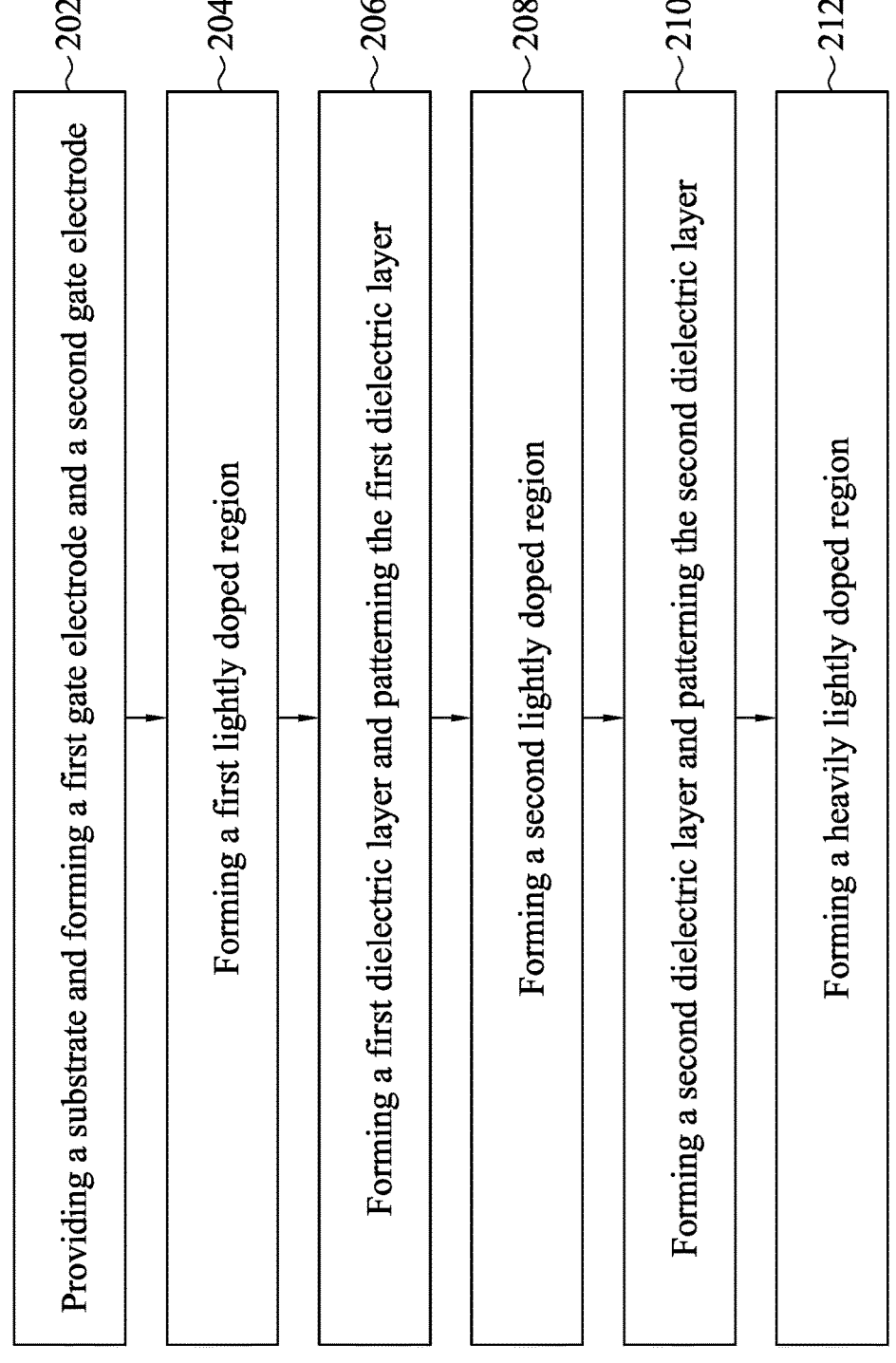

200

Providing a substrate and forming a first gate electrode and a second gate electrode ⟞ 202

Forming a first lightly doped region ⟞ 204

Forming a first dielectric layer and patterning the first dielectric layer ⟞ 206

Forming a second lightly doped region ⟞ 208

Forming a second dielectric layer and patterning the second dielectric layer ⟞ 210

Forming a heavily lightly doped region ⟞ 212

FIG. 5

SEMICONDUCTOR DEVICE INCLUDING MULTIPLE SPACERS AND A METHOD FOR PREPARING THE SAME

TECHNICAL FIELD

The present disclosure relates to a semiconductor device and a method for preparing the semiconductor structure, and in particular to a semiconductor device including a spacer structure with two or more spacers and a method for preparing the semiconductor structure.

DISCUSSION OF THE BACKGROUND

With the rapid growth of the electronics industry, the development of integrated circuits (ICs) has achieved high performance and miniaturization. Technological advances in IC materials and design have resulted in repeated evolutions of IC development, each of which provides increasingly smaller and more complex circuits.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, where F stands for the photolithographic minimum feature dimension or critical dimension (CD). However, recently, DRAM manufacturers face the tremendous challenge of shrinking the memory cell area. Further, the size in the peripheral region of the DRAM should also be reduced correspondingly, which complicates the manufacturing processes.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a gate electrode, a first spacer, and a second spacer. The gate electrode is disposed on the substrate. The first spacer is disposed on a sidewall of the gate electrode. The second spacer covers the first spacer. The first spacer includes dopants.

Another aspect of the present disclosure provides a semiconductor device. The semiconductor device includes a substrate, a plurality of first gate electrodes, a first spacer, a first lightly doped region, a second lightly doped region. Each of the plurality of first gate electrodes is disposed on the substrate. The first spacer is disposed on a sidewall of each of the plurality of first gate electrodes. The first lightly doped region is disposed within the substrate and between two of the plurality of first gate electrodes. The second lightly doped region is disposed within the substrate and between two of the plurality of first gate electrodes. The first lightly doped region overlaps the second lightly doped region. The first lightly doped region has a first dimension. The second lightly doped region has a second dimension less than the first dimension along a first direction.

Another aspect of the present disclosure provides a method for manufacturing a semiconductor device. The method includes: providing a substrate; forming a first gate electrode on the substrate; forming a second gate electrode on the substrate and adjacent to the first gate electrode; forming a first dielectric layer covering the first gate electrode and the second gate electrode; patterning the first dielectric layer to form a first spacer on a sidewall of the first gate electrode and a second spacer on a sidewall of the second gate electrode; forming a second dielectric layer covering the first spacer and the second spacer; and patterning the second dielectric layer to form a third spacer covering the first spacer and a fourth spacer covering the second spacer.

The embodiments of the present disclosure provide a method for preparing a semiconductor device. The method includes at least two cycles of depositing dielectric layers and patterning the dielectric layers, which thereby defines multiple spacers. The spacers defined by the first cycle can be used to define a lightly doped region of a different profile. Further, by multiple cycles of forming spacers, the dimension of the entire spacer can be reduced.

The foregoing outlines rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 5 is a flowchart illustrating a method for preparing a semiconductor device, in accordance with some embodiments of the present disclosure.

DETAILED DESCRIPTION

Figure 1A:
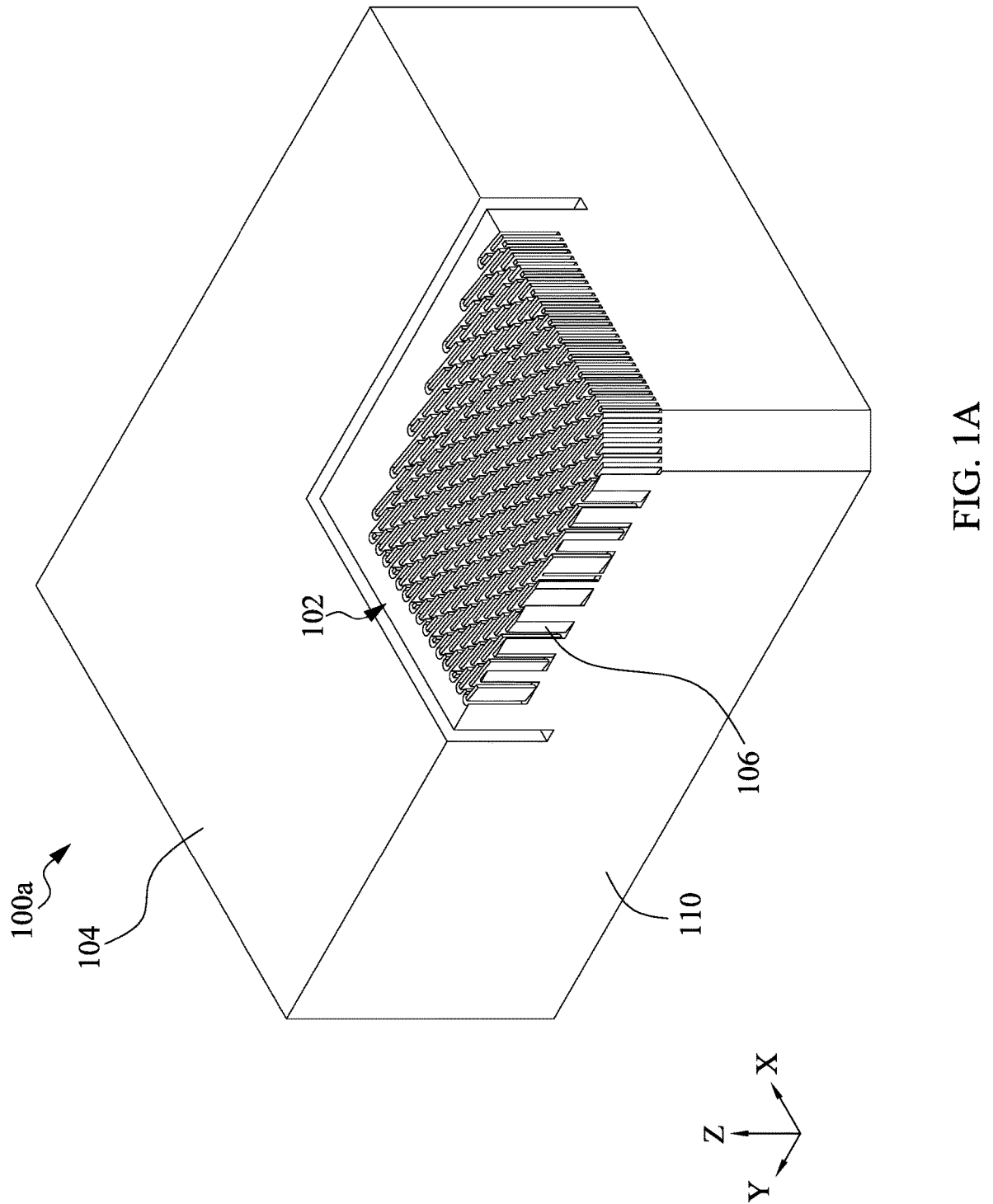
FIG. 1A is a perspective view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A is a perspective view of a semiconductor device 100a, in accordance with some embodiments of the present disclosure.

The semiconductor device 100a may include an array region 102 and a peripheral region 104. The array region 102 may be at least partially surrounded by the peripheral region 104. The array region 102 may be utilized to form a memory device. The memory device can include, for example, a dynamic random access memory (DRAM) device, a one-time programming (OTP) memory device, a static random access memory (SRAM) device, or other suitable memory devices. A plurality of pillars 106 may be formed within the array region 102. Each of the pillars 106 may include a capacitor and other suitable structures. The array region 102 may include transistors to turn on and/or turn off the memory device.

In some embodiments, the peripheral region 104 may be utilized to form, for example, an amplify circuit, or other suitable circuits. The circuits within the peripheral region 104 may be signally and/or electrically coupled to the components (e.g., capacitors and transistors) in the array region 102.

The semiconductor device 100a may include a substrate 110. The aforesaid components of the array region 102 and the peripheral region 104 may be formed within and/or on the substrate 110. The substrate 110 may be a semiconductor substrate, such as a bulk semiconductor, a semiconductor-on-insulator (SOI) substrate, or the like. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

Figure 1B:
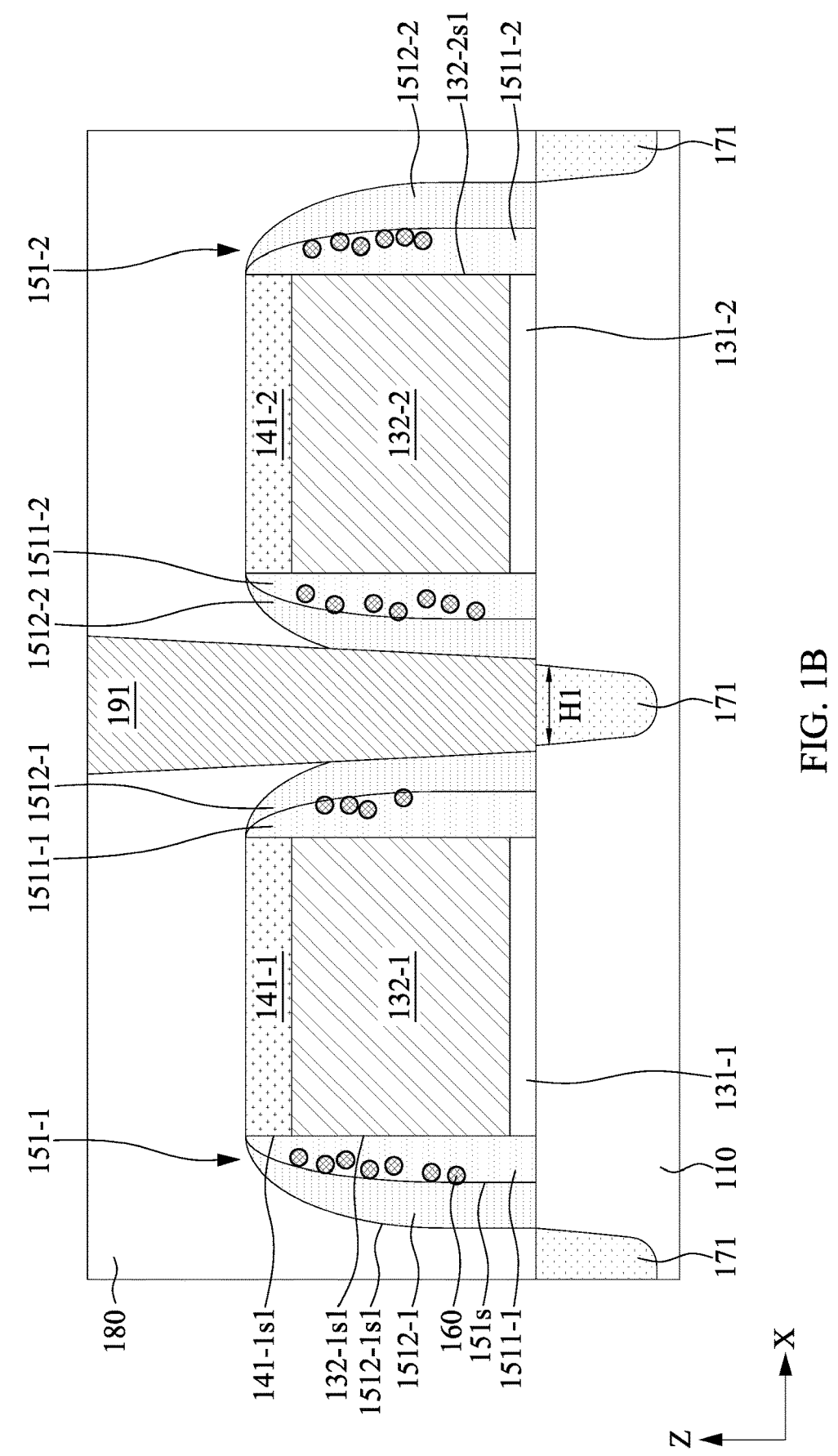
FIG. 1B is a cross-sectional view of the peripheral region of the semiconductor device, in accordance with some embodiments of the present disclosure.

FIG. 1B is a partial cross-sectional view of the peripheral region 104 of the semiconductor device 100a, in accordance with some embodiments of the present disclosure. In some embodiments, the semiconductor device 100a may further include gate dielectric layers 131-1 and 131-2, gate electrodes 132-1 and 132-2, mask layers 141-1 and 141-2, spacer structures 151-1 and 151-2, a heavily doped region 171, a dielectric structure 180, and a conductive 191.

In some embodiments, each of the gate dielectric layers 131-1 and 131-2 may be disposed on the substrate 110. Each of the gate dielectric layers 131-1 and 131-2 may have a single layer or a multilayered structure. In some embodiments, each of the gate dielectric layers 131-1 and 131-2 may include a dielectric material, such as silicon oxide, silicon nitride, silicon oxynitride, other dielectric materials, or a combination thereof. In some embodiments, each of the gate dielectric layers 131-1 and 131-2 is a multilayered structure that includes an interfacial layer and a high-k (dielectric constant greater than 4) dielectric layer. The interfacial layer can include dielectric material such as silicon oxide, silicon nitride, silicon oxynitride, other dielectric materials, or a combination thereof. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

In some embodiments, each of the gate electrodes 132-1 and 132-2 may be disposed on the substrate 110. The gate electrode 132-1 may be disposed on the gate dielectric layer 131-1. The gate electrode 132-2 may be disposed on the gate dielectric layer 131-2.

Each of the gate electrodes 132-1 and 132-2 may include polysilicon, silicon-germanium, and at least one metallic material including elements and compounds such as Mo, Cu, W, Ti, Ta, TiN, TaN, NiSi, CoSi, or other suitable conductive materials known in the art. In some embodiments, each of the gate electrodes 132-1 and 132-2 includes a work function metal layer that provides a metal gate with an n-type-metal work function or p-type-metal work function. The p-type-metal work function materials include materials such as ruthenium, palladium, platinum, cobalt, nickel, conductive metal oxide, or other suitable materials. The n-type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials.

In some embodiments, the mask layer 141-1 may be disposed on the gate electrode 132-1. The mask layer 141-1 may cover the gate electrode 132-1. In some embodiments, the mask layer 141-2 may be disposed on the gate electrode 132-2. The mask layer 141-2 may cover the gate electrode 132-2. In some embodiments, each of the mask layers 141-1 and 141-2 may include a dielectric material, such as silicon oxide, silicon nitride, silicon oxynitride, other dielectric materials, or a combination thereof.

In some embodiments, the spacer structure 151-1 may be disposed on a surface 132-1s1 of the gate electrode 132-1. In some embodiments, the spacer structure 151-1 may be disposed on a sidewall (not annotated) of the gate dielectric layer 131-1. In some embodiments, the spacer structure 151-1 may be disposed on a sidewall 141-1s1 (or a lateral surface) of the mask layer 141-1. The spacer structure 151-1 may include a spacer 1511-1 and a spacer 1512-1.

In some embodiments, the spacer 1511-1 may be disposed on the surface 132-1s1 of the gate electrode 132-1. The spacer 1511-1 may be disposed on the sidewall 141-1s1 of the mask layer 141-1. The spacer 1511-1 may be disposed between the spacer 1512-1 and the gate electrode 132-1. The spacer 1511-1 may include a dielectric material, such as silicon oxide, silicon nitride, silicon oxynitride, other dielectric materials, or a combination thereof. The material of the spacer 1511-1 may be different from that of the mask layer 141-1.

In some embodiments, dopants 160 may be doped into the spacer 1511-1. Each of the dopants 160 may include a p-type conductive type or an n-type conductive type. In some embodiments, p-type dopants may include boron (B), other group III elements, or any combination thereof. In some embodiments, n-type dopants may include arsenic (As), phosphorus (P), other group V elements, or any combination thereof. In some embodiments, the dopants 160 may be located adjacent to the surface 151s of the spacer 1511-1. The surface 151s may also be considered as the interface between the spacers 1511-1 and 1512-1.

In some embodiments, the spacer 1512-1 may be disposed on the spacer 1511-1. In some embodiments, the spacer 1512-1 may cover the spacer 1511-1. The spacers 1511-1 and 1512-1 may be formed by two cycles of depositing and patterning (or etching) dielectric layers. In some embodiments, the spacer 1512-1 may cover the surface 151s of the spacer 1511-1. The spacer 1512-1 may include a dielectric material, such as silicon oxide, silicon nitride, silicon oxynitride, other dielectric materials, or a combination thereof. In some embodiments, the material of the spacer 1512-1 may be the same as that of the spacer 1511-1. In some embodiments, the material of the spacer 1512-1 may be different from that of the spacer 1511-1. The spacer 1512-1 may have a surface 1512-1s1 (or an external surface) facing away from the spacer 1511. In some embodiments, a surface roughness of the surface 151s may be greater than a surface roughness of the surface 1512-1s1.

In some embodiments, the spacer structure 151-2 may be disposed on a surface 132-2s1 of the gate electrode 132-2. In some embodiments, the spacer structure 151-2 may be disposed on a sidewall (not annotated) of the gate dielectric layer 131-2. In some embodiments, the spacer structure 151-2 may be disposed on a sidewall (not annotated) of the mask layer 141-2. The spacer structure 151-2 may include a spacer 1511-2 and a spacer 1512-2.

In some embodiments, the spacer 1511-2 may be disposed on the surface 132-2s1 of the gate electrode 132-2. The spacer 1511-2 may be disposed between the spacer 1511-2 and the gate electrode 132-2. The spacer 1511-2 may include a dielectric material, such as silicon oxide, silicon nitride, silicon oxynitride, other dielectric materials, or a combination thereof. The material of the spacer 1511-2 may be the same as that of the spacer 1511-1. In some embodiments, dopants 160 may be doped into the spacer 1511-2.

In some embodiments, the spacer 1512-2 may be disposed on the spacer 1511-2. In some embodiments, the spacer 1512-2 may cover the spacer 1511-2. The spacers 1511-2 and 1512-2 may be formed by two cycles of depositing and patterning (or etching) dielectric layers. The spacer 1512-2 may include a dielectric material, such as silicon oxide, silicon nitride, silicon oxynitride, other dielectric materials, or a combination thereof. In some embodiments, the material of the spacer 1512-2 may be the same as that of the spacer 1511-2. In some embodiments, the material of the spacer 1512-2 may be different from that of the spacer 1511-2.

In some embodiments, the heavily doped region 171 may be formed within the substrate 110. In some embodiments, the heavily doped region 171 may be located between the spacer structures 151-1 and 151-2. In some embodiments, the heavily doped region 171 may be located between the spacers 1512-1 and 1512-2. In some embodiments, the heavily doped region 171 may be free from overlapping the spacer 1511-1 along the Z direction. In some embodiments, the heavily doped region 171 may be free from overlapping the spacer 1511-2 along the Z direction. The heavily doped region 171 may serve as a source or a drain region of the semiconductor device 100a. The heavily doped region 171 may include p-type dopants or n-type dopants.

In some embodiments, the heavily doped region 171 may have a dimension H1 (e.g., width or length) along the X direction. In some embodiments, the dimension H1 of the heavily doped region 171 may be determined by the dimensions (not annotated) of the spacer structures 151-1 and 151-2.

The dielectric structure 180 may cover the gate electrode 132-1. The dielectric structure 180 may cover the gate electrode 132-2. The dielectric structure 180 may cover the spacer structure 151-1. The dielectric structure 180 may cover the spacer structure 151-2. The dielectric structure 180 may cover the spacer 1511-1. The dielectric structure 180 may cover the spacer 1512-1. The dielectric structure 180 may cover the spacer 1511-2. The dielectric structure 180 may cover the spacer 1512-2. In some embodiments, the dielectric structure 180 may include a dielectric material, such as silicon oxide, silicon nitride, silicon oxynitride, other dielectric materials, or a combination thereof.

In some embodiments, the conductive 191 may be disposed on the substrate 110. In some embodiments, the conductive 191 may be disposed between the spacer structures 151-1 and 151-2. In some embodiments, the conductive 191 may penetrate the dielectric structure 180. In some embodiments, the conductive 191 may be in contact with the spacer structure 151-1. In some embodiments, the conductive 191 may be in contact with the spacer 1512-1. In some embodiments, the conductive 191 may be spaced apart from the spacer 1511-1 by the spacer 1512-1. The conductive 191 may be connected (e.g., electrically connected) to the heavily doped region 171. In some embodiments, the conductive 191 may include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

The sizes of the components and/or the distances between the components in the peripheral region 104 are reduced because of the miniaturization of the memory device (e.g., the components in the array region 102). For example, the size of the source/drain region (e.g., 171), gate electrode (e.g., 132-1 and 132-2) as well as the distance between the gate electrodes in the peripheral region 104 are reduced correspondingly. However, to meet a required electrical property of the semiconductor device 100a, the dimension (e.g., thickness) of the spacer structures (e.g., 151-1 and 151-2) cannot be reduced proportionally. In a comparative example, the spacer is formed by one cycle of depositing and patterning a dielectric layer. The dielectric layer deposited between the gate electrodes may have a significant thickness. As a result, after an etching technique is performed, the dielectric layer may remain over a region in which a heavily doped region (e.g., source/drain region) is formed. Therefore, the heavily doped region cannot be formed properly. In this embodiment, the spacer structure (e.g., 151-1 and 151-2) may be formed by at least two cycles of depositing and patterning a dielectric layer, which thereby ensures that the dielectric layers in each cycle may be patterned properly. As a result, the heavily doped region (e.g., 171) may be properly formed within the substrate (e.g., 110).

Figure 2:
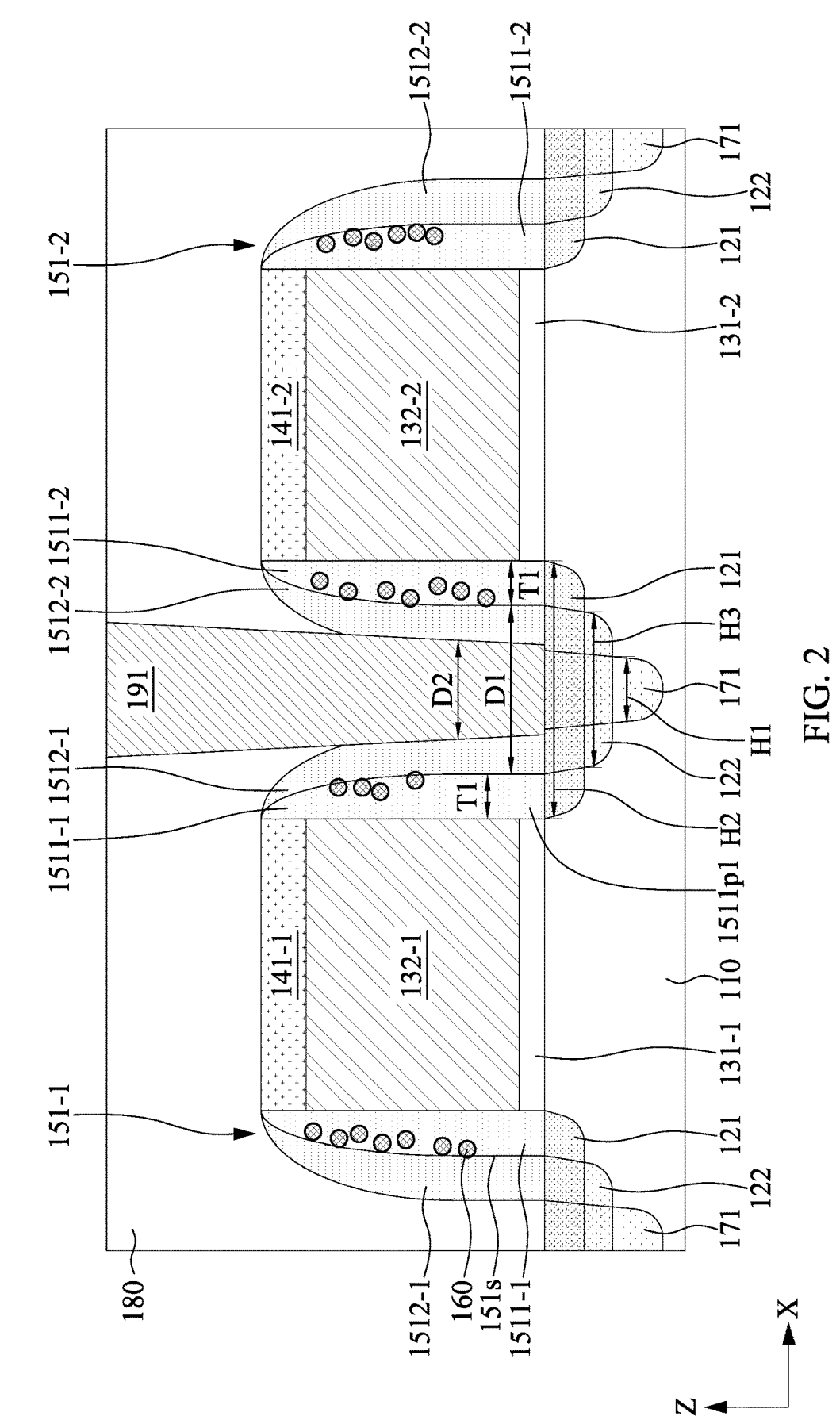
FIG. 2 is a cross-sectional view of a semiconductor device, in accordance with some embodiments of the present disclosure.

FIG. 2 is a cross-sectional view of a semiconductor device 100b, in accordance with some embodiments of the present disclosure. The semiconductor device 100b is similar to the semiconductor device 100a as shown in FIG. 1B, and the differences therebetween are described below.

In some embodiments, the semiconductor device 100b may further include a lightly doped region 121 and a lightly doped region 122.

In some embodiments, the lightly doped region 121 may be located within the substrate 110. The lightly doped region 121 may be located between the spacer structures 151-1 and 151-2. In some embodiments, the lightly doped region 121 may overlap the spacer 1511-1 along the Z direction. In some embodiments, the lightly doped region 121 may overlap the spacer 1512-1 along the Z direction. In some embodiments, the lightly doped region 121 may overlap the spacer 1511-2 along the Z direction. In some embodiments, the lightly doped region 121 may overlap the spacer 1512-2 along the Z direction. The lightly doped region 121 may overlap the heavily doped region 171. The lightly doped region 121 may function as a lightly doped source (LDS) or a lightly doped drain (LDD). The dopant concentration of the lightly doped region 121 may be less than that of the heavily doped region 171. The lightly doped region 121 may have a conductive type the same as that of the heavily doped region 171. In some embodiments, the lightly doped region 121 may have a dimension H2 (e.g., width or length) along the X direction. In some embodiments, the dimension H2 of the lightly doped region 121 may be determined by a distance (not annotated) between the gate electrodes 132-1 and 132-2.

In some embodiments, the lightly doped region 122 may be located within the substrate 110. The lightly doped region 122 may be located between the spacers 1511-1 and 1511-2. In some embodiments, the lightly doped region 121 may overlap the spacer 1512-1 along the Z direction. In some embodiments, the lightly doped region 122 may be optional. In some embodiments, the lightly doped region 121 may overlap the spacer 1512-2 along the Z direction. In some embodiments, a portion 1511p of the spacer 1511-1 may be free from overlapping the lightly doped region 122 along the Z direction. In some embodiments, a portion (not annotated) of the spacer 1511-2 may be free from overlapping the lightly doped region 122 along the direction. The lightly doped region 122 may overlap the lightly doped region 121. The lightly doped region 122 may overlap the heavily doped region 171. The lightly doped region 122 may function as the LDD or LDS. The dopant concentration of the lightly doped region 122 may be less than that of the heavily doped region 171. The dopant concentration of the lightly doped region 122 may be the same as or similar to that of the lightly doped region 121. The lightly doped region 122 may have a conductive type the same as that of the heavily doped region 171. In some embodiments, the dopant of the lightly doped region 122 may be the same as dopants 160. For example, when the dopants 160 includes phosphorus, the lightly doped region 122 includes phosphorus. In some embodiments, the lightly doped region 121 may have a dimension H3 (e.g., width or length) along the X direction. In some embodiments, the dimension H3 of the lightly doped region 122 may be less than that the dimension H2 of the lightly doped region 121.

In some embodiments, the dimension H3 of the lightly doped region 122 may be determined by a distance D1 between the spacers 1511-1 and 1512-1. In some embodiments, the dimension H3 of the lightly doped region 122 may be determined by a thickness T1 of the spacers 1511-1 and 1511-2. In some embodiments, the lightly doped region 122 may have a depth greater than that of the lightly doped region 121.

In some embodiments, the dimension H1 of the heavily doped region 171 may be determined by a distance D2 between the spacers 1512-1 and 1512-2. In some embodiments, the heavily doped region 171 may have a depth greater than that of the lightly doped region 122.

In this embodiment, the spacer structures 151-1 and 151-2 may be formed by at least two cycles of depositing and patterning dielectric layers, and the dimension of the lightly doped region 122 may be determined and/or controlled by a spacer formed in the first cycle. Thus, at least two profiles of the LDD (or LDS) may be well modified and/or controlled.

Figure 3:
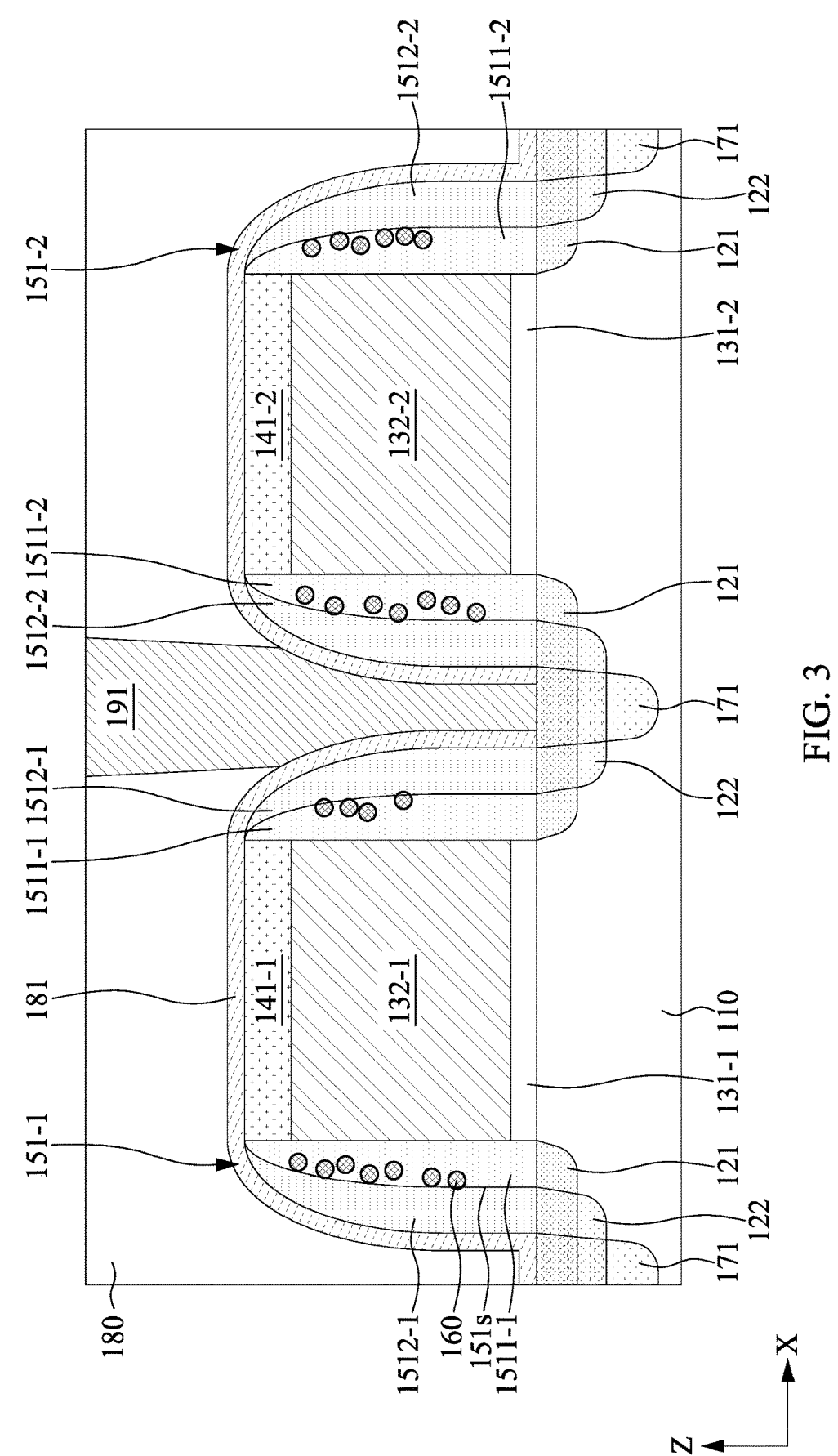
FIG. 3 is a cross-sectional view of a semiconductor device, in accordance with some embodiments of the present disclosure.

FIG. 3 is a cross-sectional view of a semiconductor device 100c, in accordance with some embodiments of the present disclosure. The semiconductor device 100c is similar to the semiconductor device 100b as shown in FIG. 2, and the differences therebetween are described below.

In some embodiments, the semiconductor device 100c may further include a spacer protection layer 181. In some embodiments, the spacer protection layer 181 may cover the gate electrode 132-1. In some embodiments, the spacer protection layer 181 may cover and be in contact with the mask layer 141-1. In some embodiments, the spacer protection layer 181 may cover the spacer structure 151-1. In some embodiments, the spacer protection layer 181 may cover the spacer 1511-1. In some embodiments, the spacer protection layer 181 may cover and be in contact with the spacer 1512-1. In some embodiments, the spacer protection layer 181 may cover the gate electrode 132-2. In some embodiments, the spacer protection layer 181 may cover and be in contact with the mask layer 141-2. In some embodiments, the spacer protection layer 181 may cover the spacer structure 151-2. In some embodiments, the spacer protection layer 181 may cover the spacer 1511-2. In some embodiments, the spacer protection layer 181 may cover and be in contact with the spacer 1512-2.

The spacer protection layer 181 may include a dielectric layer, such as silicon oxide, silicon nitride, silicon oxynitride, other dielectric materials, or a combination thereof.

The material of the spacer protection layer 181 may be different from that of the dielectric structure 180. The material of the spacer protection layer 181 may be different from that of the spacer 1512-1. In some embodiments, the conductive 191 may be separated from the spacer 1512-1 by the spacer protection layer 181. In some embodiments, the conductive 191 may be separated from the spacer 1512-2 by the spacer protection layer 181. In some embodiments, the spacer protection layer 181 may be in contact with the conductive 191.

Figure 4:
FIG. 4 is a cross-sectional view of a semiconductor device, in accordance with some embodiments of the present disclosure.

FIG. 4 is a cross-sectional view of a semiconductor device 100d, in accordance with some embodiments of the present disclosure. The semiconductor device 100d is similar to the semiconductor device 100b as shown in FIG. 2, and the differences therebetween are described below.

The semiconductor device 100d may have a region 112 and a region 114. The components described in the FIG. 1B, FIG. 2 and/or FIG. 3 may be located within the region 112.

In some embodiments, the region 114 of the semiconductor device 100d may further include lightly doped regions 123 and 124, gate dielectric layers 133-1 and 133-2, gate electrodes 134-1 and 134-2, mask layers 142-1 and 142-2, spacer structures 152-1 and 152-2, a heavily doped region 172, and a conductive 192.

In some embodiments, the lightly doped region 123 may be located within the substrate 110. The lightly doped region 123 may function as the LDS or LDD. In some embodiments, the lightly doped region 123 may have a depth the same as or similar to that of the lightly doped region 121. In some embodiments, the dimension along the X direction of the lightly doped region 123 may be greater that of the lightly doped region 121. The dopant concentration of the lightly doped region 123 may be the same as or similar to that of the lightly doped region 121.

In some embodiments, the lightly doped region 124 may be located within the substrate 110. The lightly doped region 124 may function as the LDS or LDD. In some embodiments, the lightly doped region 124 may be optional. In some embodiments, the lightly doped region 124 may have a depth the same as or similar to that of the lightly doped region 122. In some embodiments, the dimension along the X direction of the lightly doped region 124 may be greater that of the lightly doped region 122. The dopant concentration of the lightly doped region 124 may be the same as or similar to that of the lightly doped region 122.

In some embodiments, each of the gate dielectric layers 133-1 and 133-2 may be disposed on the substrate 110. Each of the gate dielectric layers 133-1 and 133-2 may have a single layer or a multilayered structure. In some embodiments, each of the gate dielectric layers 133-1 and 133-2 may include a dielectric material the same as that of the gate dielectric layer 131-2.

In some embodiments, each of the gate electrodes 134-1 and 134-2 may be disposed on the substrate 110. The gate electrode 134-1 may be disposed on the gate dielectric layer 133-1. The gate electrode 134-2 may be disposed on the gate dielectric layer 133-2. The material of the gate electrodes 134-1 and 134-2 may be the same as that of the gate electrode 132-1. The gate electrodes 132-1 and 132-2 may have a distance P1 therebetween. The gate electrodes 134-1 and 134-2 may have a distance P2 therebetween. In some embodiments, the distance P2 may be greater than the distance P1. The dimension (e.g., width) of the gate electrode 134-1 may be the same as that of the gate electrode 132-1.

In some embodiments, the mask layer 142-1 may be disposed on the gate electrode 134-1. The mask layer 142-1 may cover the gate electrode 134-1. In some embodiments, the mask layer 142-2 may be disposed on the gate electrode 134-2. The mask layer 142-2 may cover the gate electrode 134-2.

In some embodiments, the spacer structure 152-1 may be disposed on a sidewall 134-1$s$1 of the gate electrode 134-1. In some embodiments, the spacer structure 152-1 may be disposed on a sidewall (not annotated) of the gate dielectric layer 133-1. In some embodiments, the spacer structure 152-1 may be disposed on a sidewall (not annotated) of the mask layer 142-1. The spacer structure 152-1 may include a spacer 1521-1 and a spacer 1522-1.

In some embodiments, the spacer 1521-1 may be disposed on the sidewall 134-1$s$1 of the gate electrode 134-1. The spacer 1521-1 may be disposed between the spacer 1522-1 and the gate electrode 134-1.

In some embodiments, dopants 160 may be doped into the spacer 1521-1. In some embodiments, the dopants 160 may be located adjacent to an external surface of the spacer 1521-1 or an interface between the spacers 1521-1 and 1522-1.

In some embodiments, the spacer 1522-1 may be disposed on the spacer 1521-1. In some embodiments, the spacer 1522-1 may cover the spacer 1521-1. The spacers 1521-1 and 1522-1 may be formed by two cycles of depositing and patterning (or etching) dielectric layers. The spacer 1522-1 may include a dielectric material the same as that of the spacer 1512-1.

In some embodiments, the spacer structure 152-2 may be disposed on a sidewall (not annotated) of the gate electrode 134-2. In some embodiments, the spacer structure 152-2 may be disposed on a sidewall (not annotated) of the gate dielectric layer 133-2. In some embodiments, the spacer structure 152-2 may be disposed on a sidewall (not annotated) of the mask layer 142-2. The spacer structure 152-2 may include a spacer 1521-2 and a spacer 1522-2. The dopants 160 may be doped into the spacer 1521-2.

In some embodiments, the heavily doped region 172 may be formed within the substrate 110. In some embodiments, the heavily doped region 172 may be located between the spacer structures 152-1 and 152-2. In some embodiments, the heavily doped region 172 may be located between the spacers 1522-1 and 1522-2. In some embodiments, the heavily doped region 172 may be free from overlapping the spacer 1521-1 along the Z direction. In some embodiments, the heavily doped region 172 may be free from overlapping the spacer 1521-2 along the Z direction. The heavily doped region 172 may serve as a source or a drain region. In some embodiments, the heavily doped region 172 may have a dimension H4 (e.g., width or length) along the X direction. In some embodiments, the dimension H4 of the heavily doped region 172 may be determined by the dimensions (not annotated) of the spacer structures 152-1 and 152-2. In some embodiments, the dimension H4 of the heavily doped region 172 may be different from the dimension H3 of the heavily doped region 171.

In some embodiments, the conductive 192 may be disposed on the substrate 110. In some embodiments, the conductive 192 may be disposed between the spacer structures 152-1 and 152-2. In some embodiments, the conductive 192 may penetrate the dielectric structure 180. In some embodiments, the conductive 192 may be spaced apart from the spacer 1522-1 by the dielectric layer 180. In some embodiments, the conductive 192 may be spaced apart from the spacer 1522-2 by the dielectric layer 180. The conductive 192 may be connected (e.g., electrically connected) to the heavily doped region 172.

In some embodiments, the conductive 192 may include conductive materials the same as or similar to those of the conductive 191. In this embodiment, the thickness of the spacer structure 152-1 may be the same as that of the spacer structure 151-1. The spacer structures 151-1 and 152-1 may be formed by the same manufacturing processes involving multiple cycles of depositing and patterning dielectric layers, which thereby simplifies the manufacturing processes of the semiconductor device 100$d$.

FIG. 5 is a flowchart illustrating a method 200 of manufacturing a semiconductor device, in accordance with some embodiments of the present disclosure.

The method 200 may begin with operation 202 in which a substrate is provided. A first gate electrode and a second gate electrode may be formed over the substrate.

The method 200 may continue with operation 204 in which a first lightly doped region is formed within the substrate and between the first gate electrode and the second gate electrode.

The method 200 may continue with operation 206 in which a first dielectric layer is formed to cover the first gate electrode, the second electrode, and the substrate. An etching technique is performed to pattern the first dielectric layer. A first spacer may be formed on a sidewall of the first gate electrode. A second spacer may be formed on a sidewall of the second gate electrode. The substrate may be exposed by the first spacer and the second spacer.

The method 200 may continue with operation 208 in which a second lightly doped region is formed within the substrate and between the first spacer and the second spacer.

The method 200 may continue with operation 210 in which a second dielectric layer is formed to cover the first spacer, the second spacer, the first gate electrode, the second electrode, and the substrate. An etching technique is performed to pattern the second dielectric layer. A third spacer may be formed to cover the first spacer. A fourth spacer may be formed to cover the second spacer. The substrate may be exposed.

The method 200 may continue with operation 212 in which a heavily doped region is formed within the substrate and between the third spacer and the fourth spacer.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 5. In some embodiments, the method 200 can include one or more operations depicted in FIG. 5.

FIG. 6A, FIG. 6B, FIG. 6C, FIG. 6D, FIG. 6E, FIG. 6F, FIG. 6G, FIG. 6H, and FIG. 6I illustrate one or more stages of an exemplary method for manufacturing a semiconductor device according to some embodiments of the present disclosure.

Figure 6A:
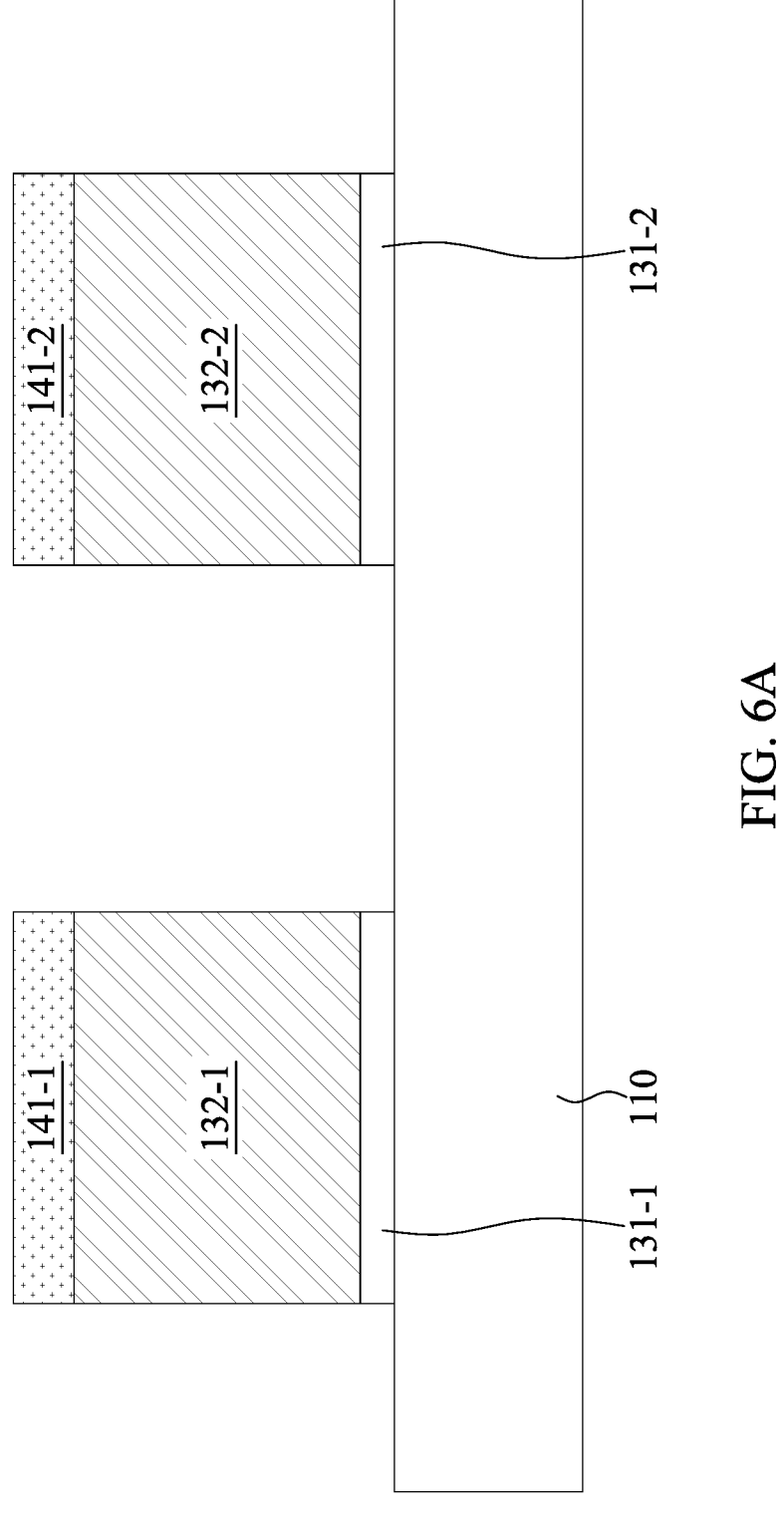
FIG. 6A illustrates one or more stages of an exemplary method for manufacturing a semiconductor device according to some embodiments of the present disclosure.

Referring to FIG. 6A, the substrate 110 may be provided. The gate dielectric layers 131-1 and 131-2 may be formed on the substrate 110. The gate electrode 132-1 may be formed on the gate dielectric layer 131-1. The gate electrode 132-2 may be formed on the gate dielectric layer 131-2. The mask layer 141-1 may be formed on the gate electrode 132-1. The mask layer 141-2 may be formed on the gate dielectric layer 131-2. Each of the gate dielectric layers 131-1 and 131-2, the gate electrodes 132-1 and 132-2, as well as the mask layers 141-1 and 141-2 may be formed by chemical vapor deposition (CVD), atomic layer deposition (ALD), physical vapor deposition (PVD), low-pressure chemical vapor deposition (LPCVD) and plasma-enhanced CVD (PECVD), or other suitable processes.

Figure 6B:
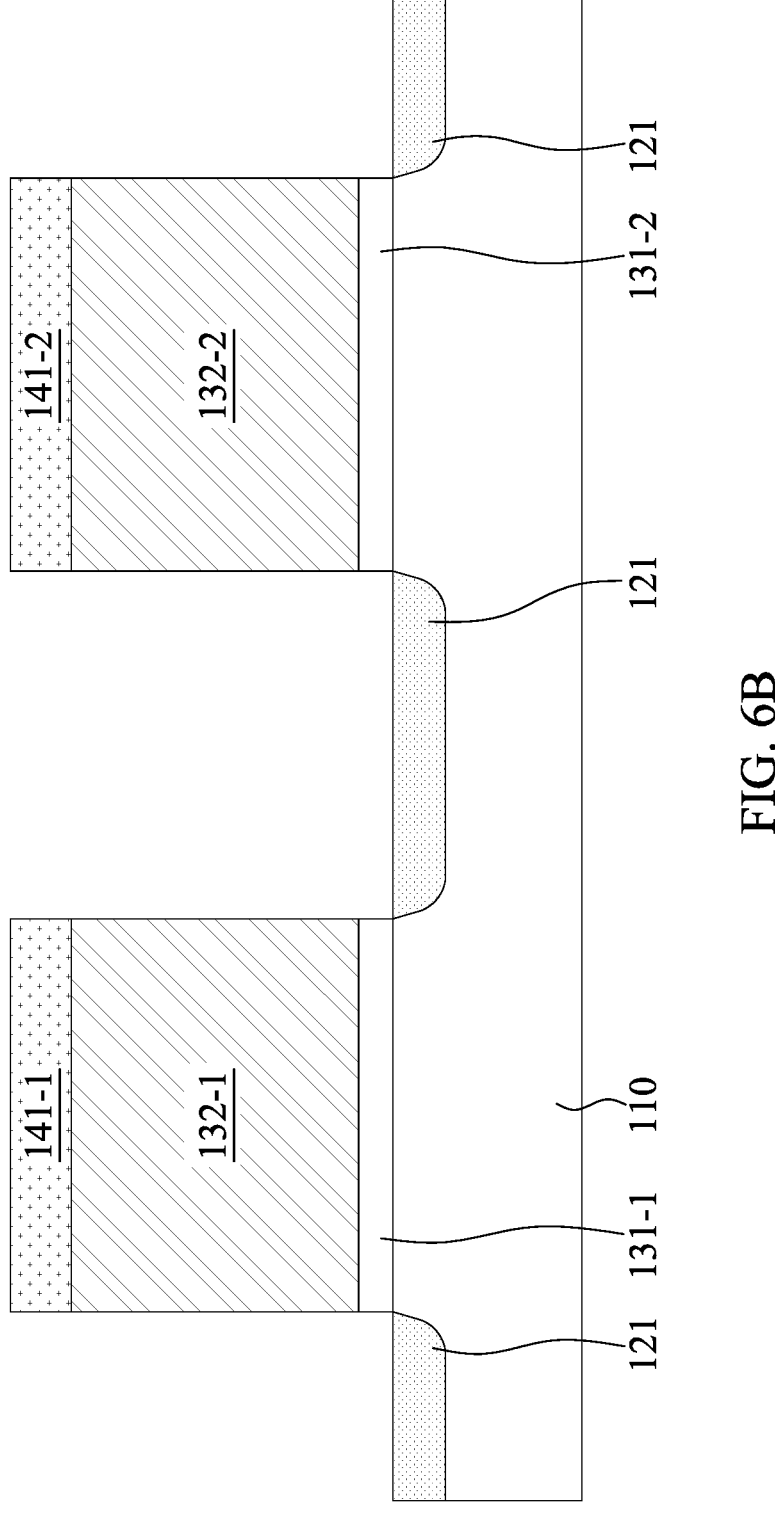
FIG. 6B illustrates one or more stages of an exemplary method for manufacturing a semiconductor device according to some embodiments of the present disclosure.

Referring to FIG. 6B, the lightly doped region 121 may be formed within the substrate 110 and between the gate electrodes 132-1 and 132-2. It should be notated that the step of forming the lightly doped region 121 may be performed before the step of forming the gate electrodes 132-1 and 132-2.

Figure 6C:
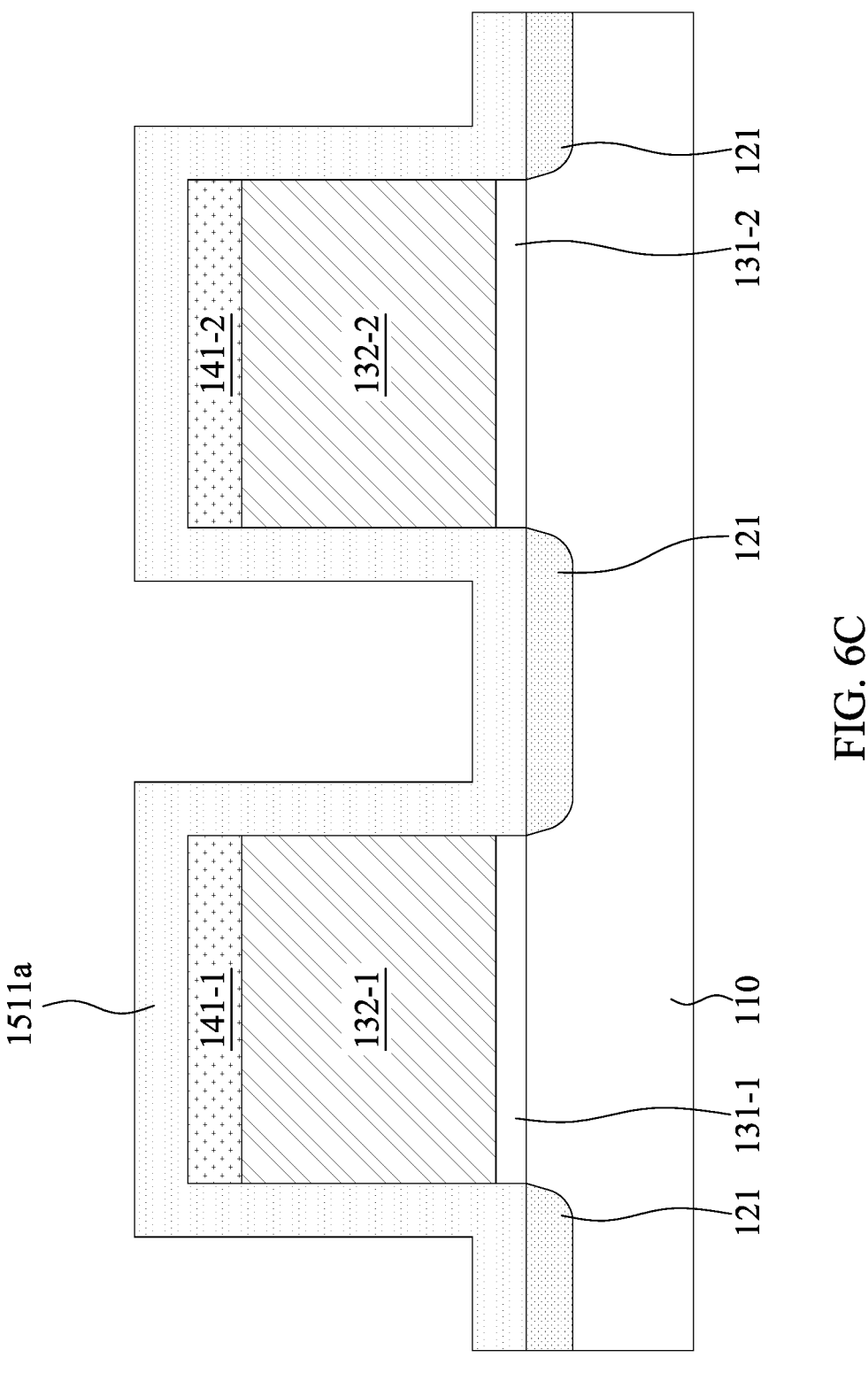
FIG. 6C illustrates one or more stages of an exemplary method for manufacturing a semiconductor device according to some embodiments of the present disclosure.

Referring to FIG. 6C, a dielectric layer 1511*a* may be formed to cover the gate electrodes 132-1 and 132-2. The dielectric layer 1511*a* may cover the substrate 110. The dielectric layer 1511*a* may be formed by, for example, CVD, ALD, PVD, LPCVD, and PECVD, or other suitable processes.

Figure 6D:
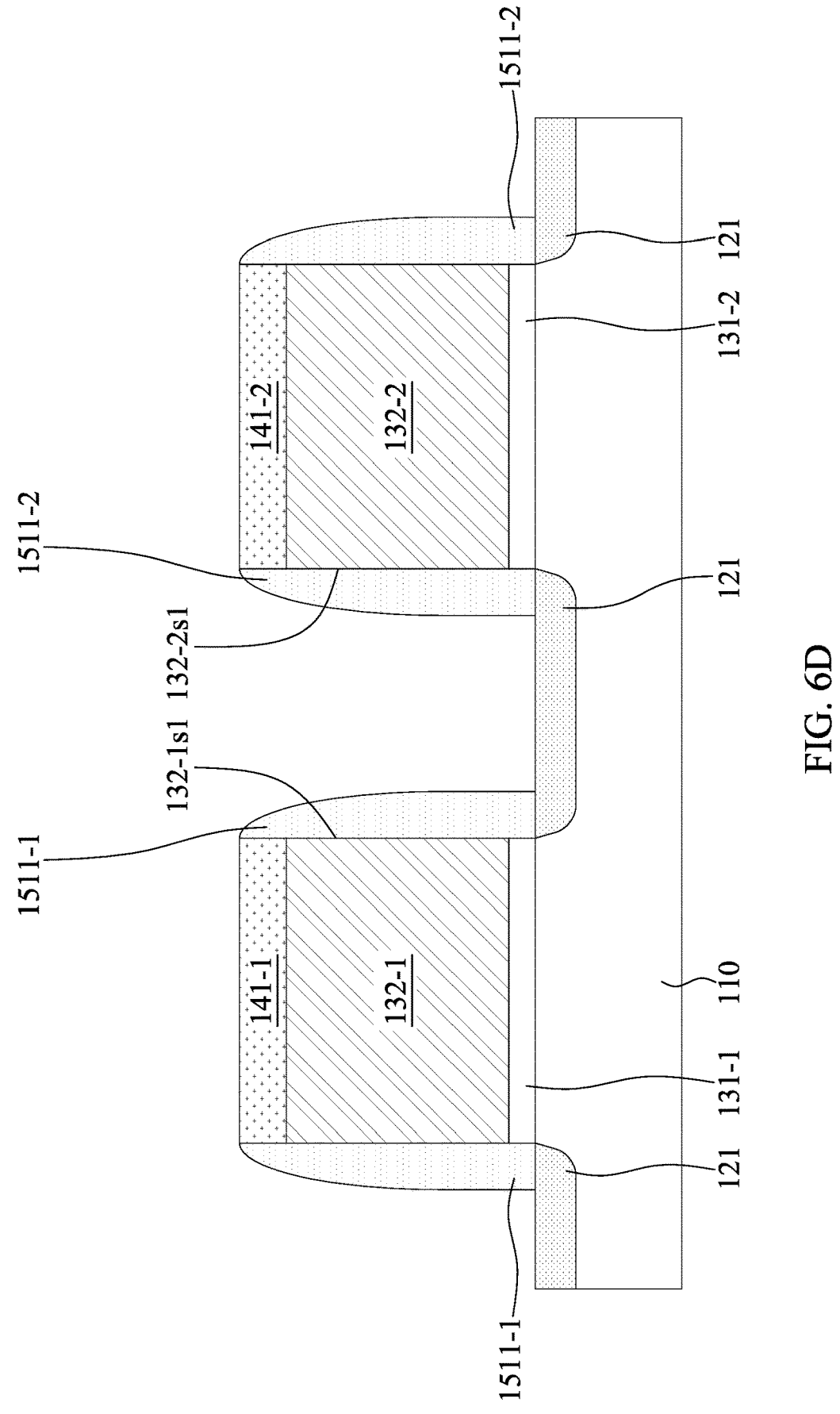
FIG. 6D illustrates one or more stages of an exemplary method for manufacturing a semiconductor device according to some embodiments of the present disclosure.

Referring to FIG. 6D, an etching technique may be performed. The dielectric layer 1511*a* may be patterned to form the spacer 1511-1 on the sidewall 132-1*s*1 of the gate electrode 132-1 and the spacer 1511-2 on the sidewall 132-2*s*1 of the gate electrode 132-2. The substrate 110 may be exposed.

Figure 6E:
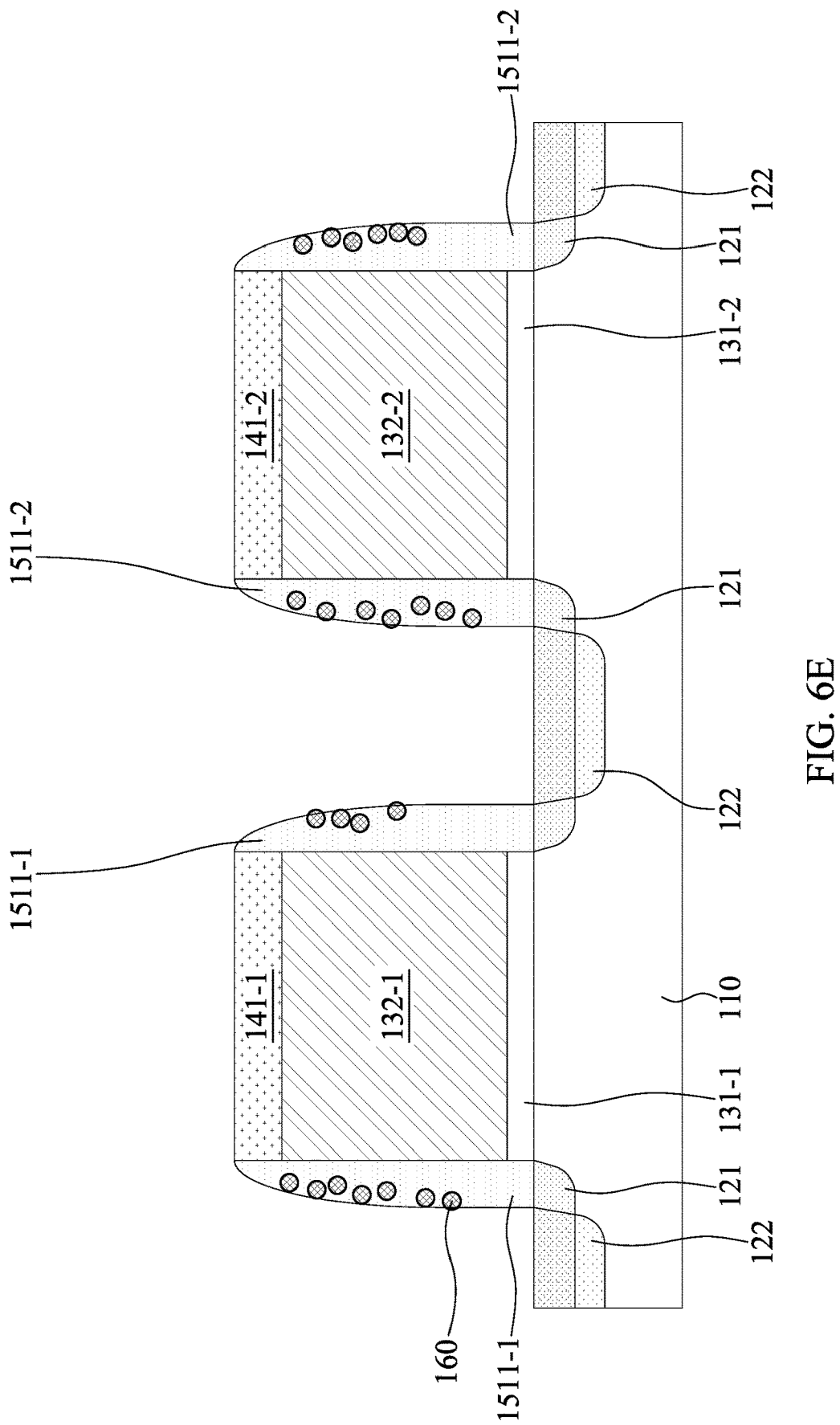
FIG. 6E illustrates one or more stages of an exemplary method for manufacturing a semiconductor device according to some embodiments of the present disclosure.

Referring to FIG. 6E, the lightly doped region 122 may be formed in the substrate 110 and between the spacers 1511-1 and 1511-2. In some embodiments, the dopants 160 may be doped into the spacers 1511-1 and 1511-2. The dimension of the lightly doped region 122 may be determined by a distance between the spacers 1511-1 and 1511-2.

Figure 6F:
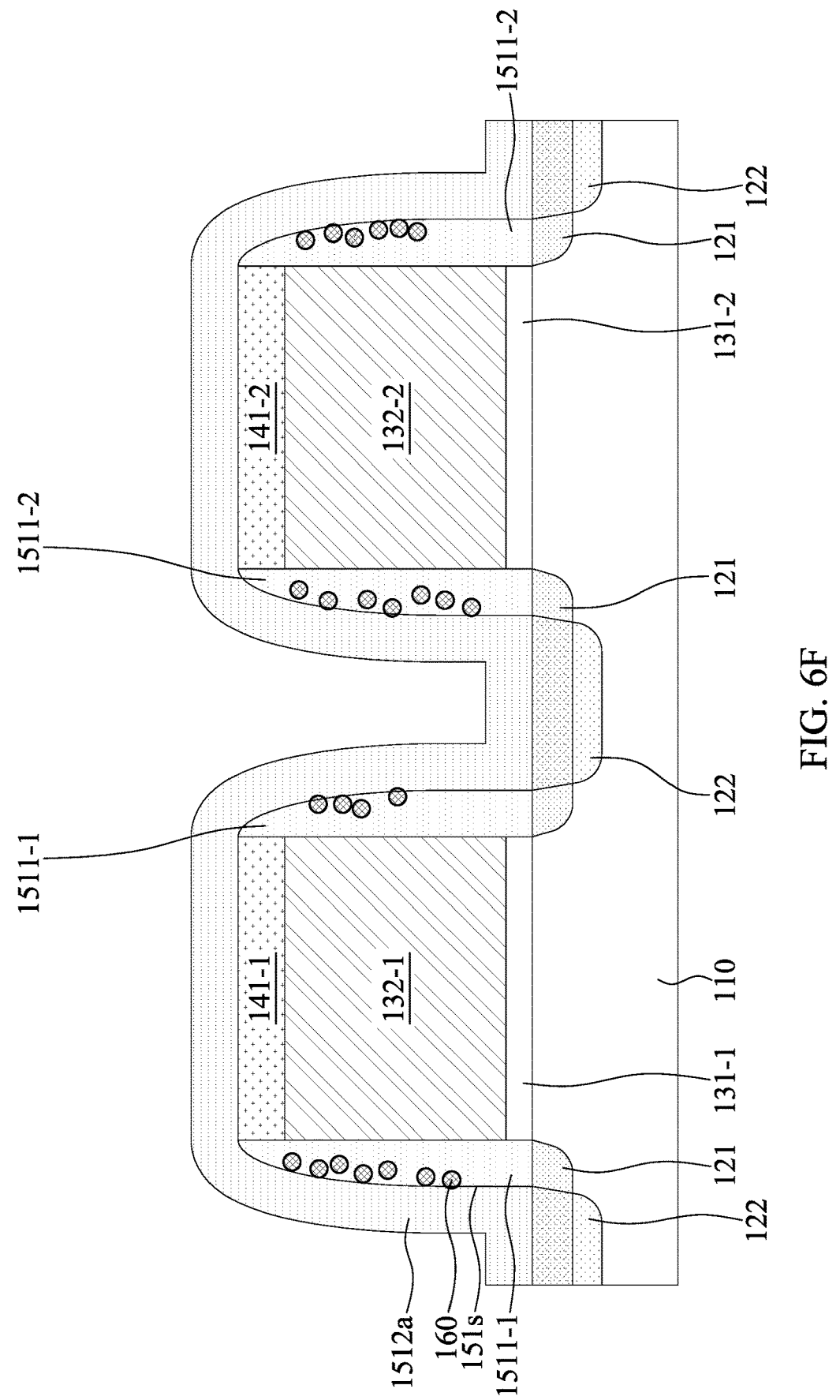
FIG. 6F illustrates one or more stages of an exemplary method for manufacturing a semiconductor device according to some embodiments of the present disclosure.

Referring to FIG. 6F, a dielectric layer 1512*a* may be formed to cover the gate electrodes 132-1 and 132-2. The dielectric layer 1512*a* may cover the spacers 1511-1 and 1511-2. The dielectric layer 1512*a* may cover the substrate 110. The dielectric layer 1512*a* may be formed by, for example, CVD, ALD, PVD, LPCVD, and PECVD, or other suitable processes. The material of the dielectric layer 1512*a* may be the same as that of the dielectric layer 1511*a*.

Figure 6G:
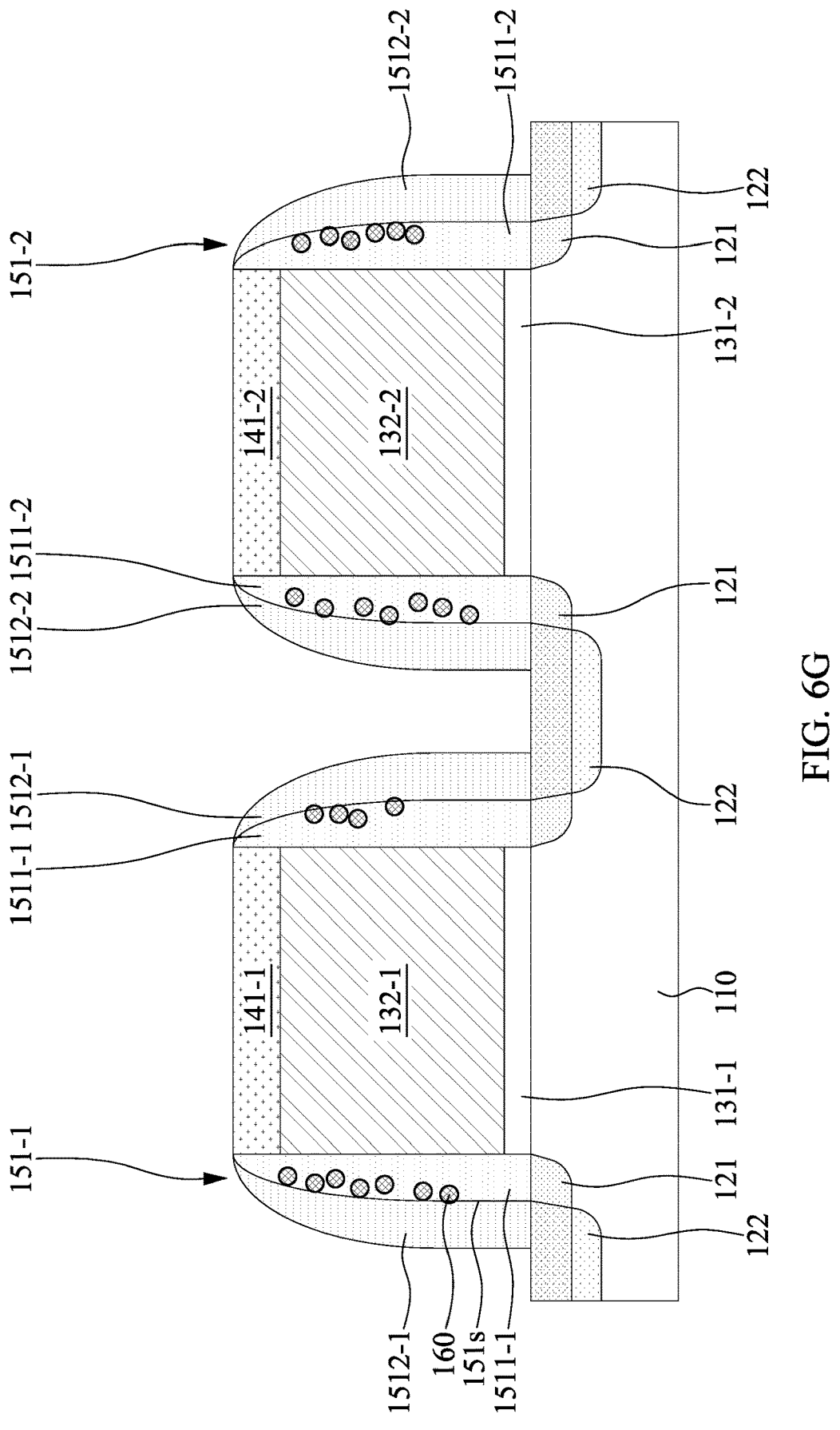
FIG. 6G illustrates one or more stages of an exemplary method for manufacturing a semiconductor device according to some embodiments of the present disclosure.

Referring to FIG. 6G, an etching technique may be performed. The dielectric layer 1512*a* may be patterned to form the spacer 1512-1 on the spacer 1511-1 and the spacer 1512-2 on the spacer 1511-2. The substrate 110 may be exposed. The spacer structures 151-1 and 151-2 may be produced.

Figure 6H:
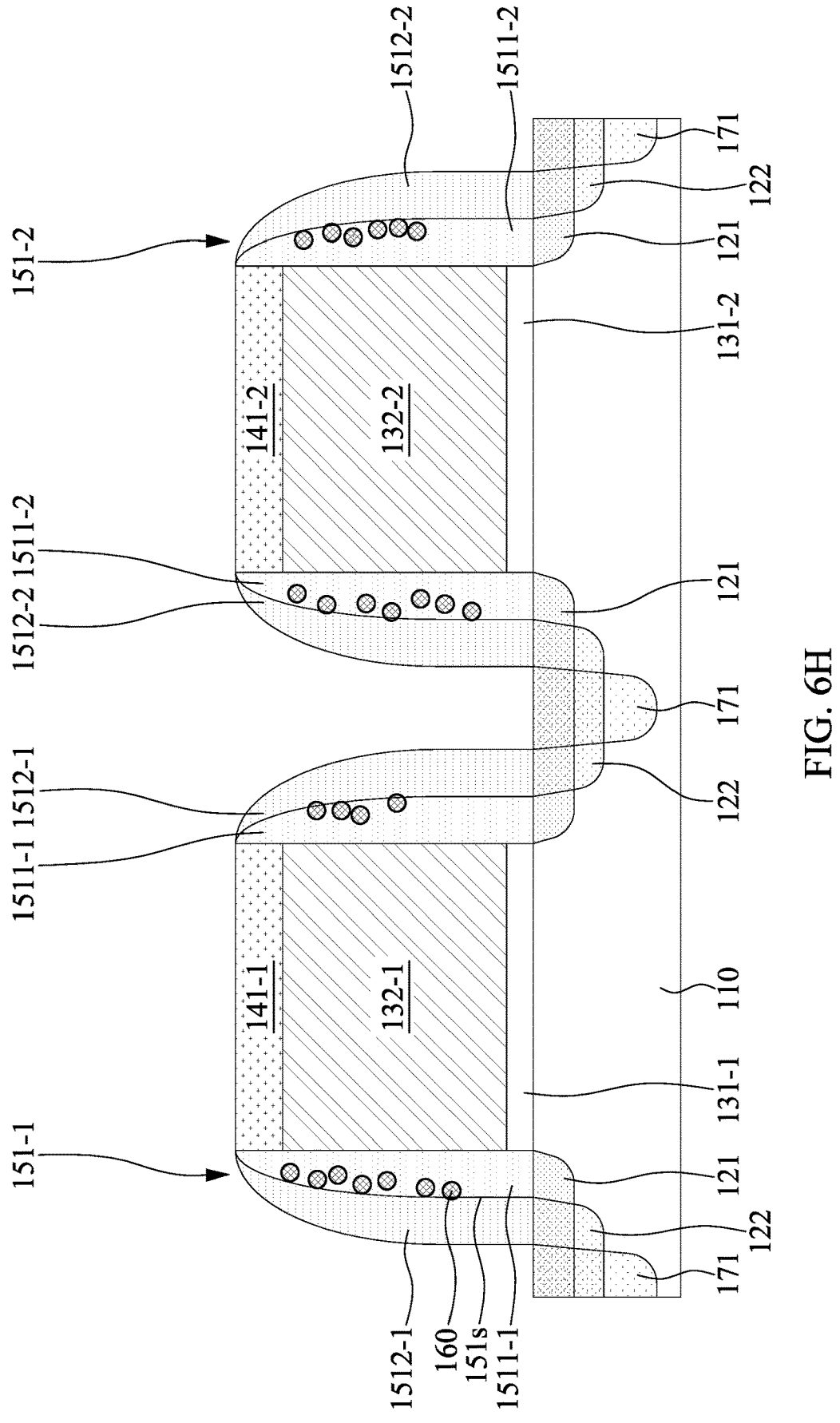
FIG. 6H illustrates one or more stages of an exemplary method for manufacturing a semiconductor device according to some embodiments of the present disclosure.

Referring to FIG. 6H, the heavily doped region 171 may be formed within the substrate 110 and between the spacers 1512-1 and 1512-2. The dimension of the lightly doped region 122 may be determined by a distance between the spacers 1512-1 and 1512-2.

Figure 6I:
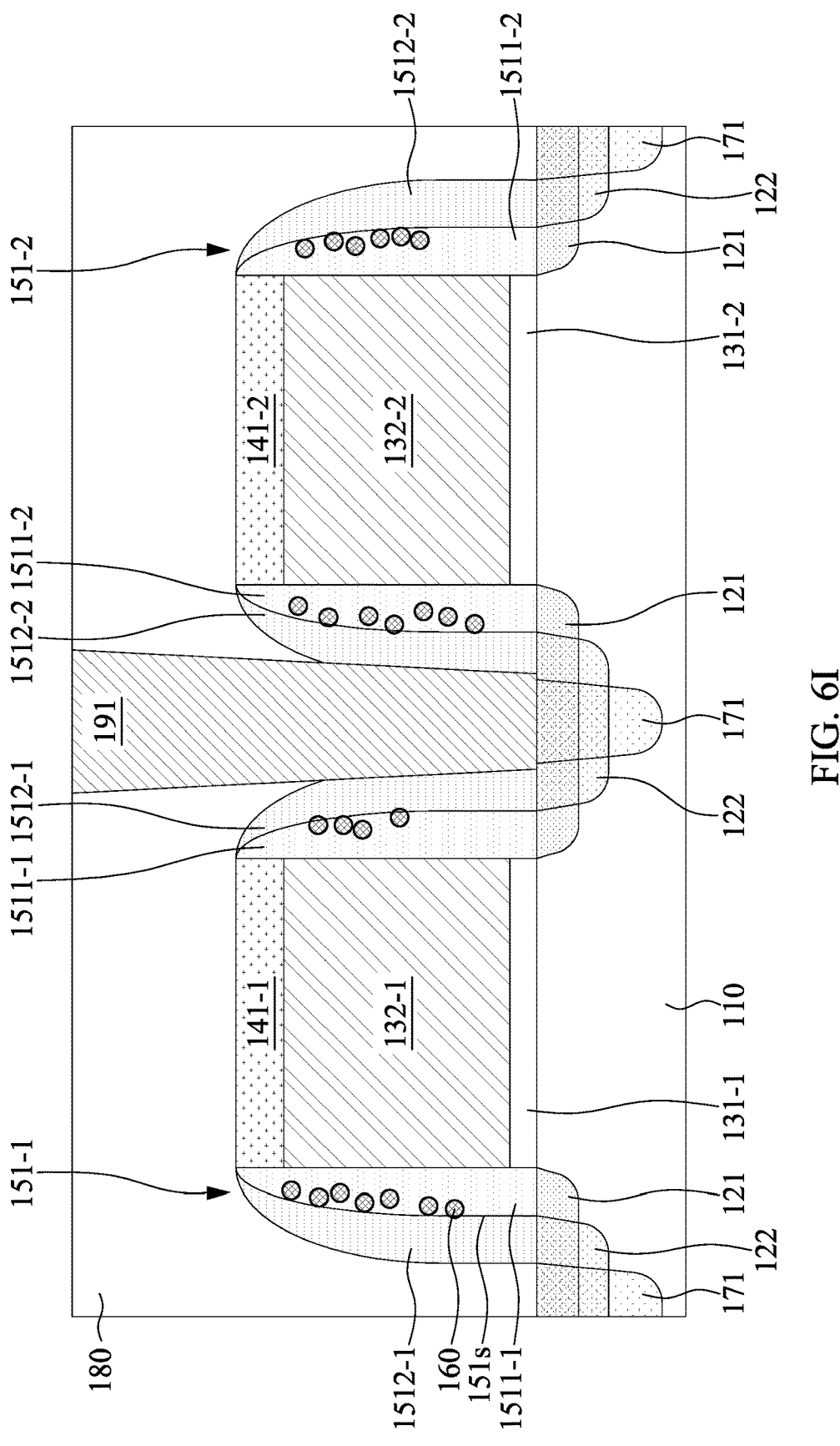
FIG. 6I illustrates one or more stages of an exemplary method for manufacturing a semiconductor device according to some embodiments of the present disclosure.

Referring to FIG. 6I, the dielectric structure 180 may be formed to cover the substrate 110, the gate electrodes 132-1 and 132-2. The conductive 191 may be formed to connect the heavily doped region 171. As a result, a semiconductor device, such as the semiconductor device 100*b* as shown in FIG. 2, may be produced.

Figure 7:
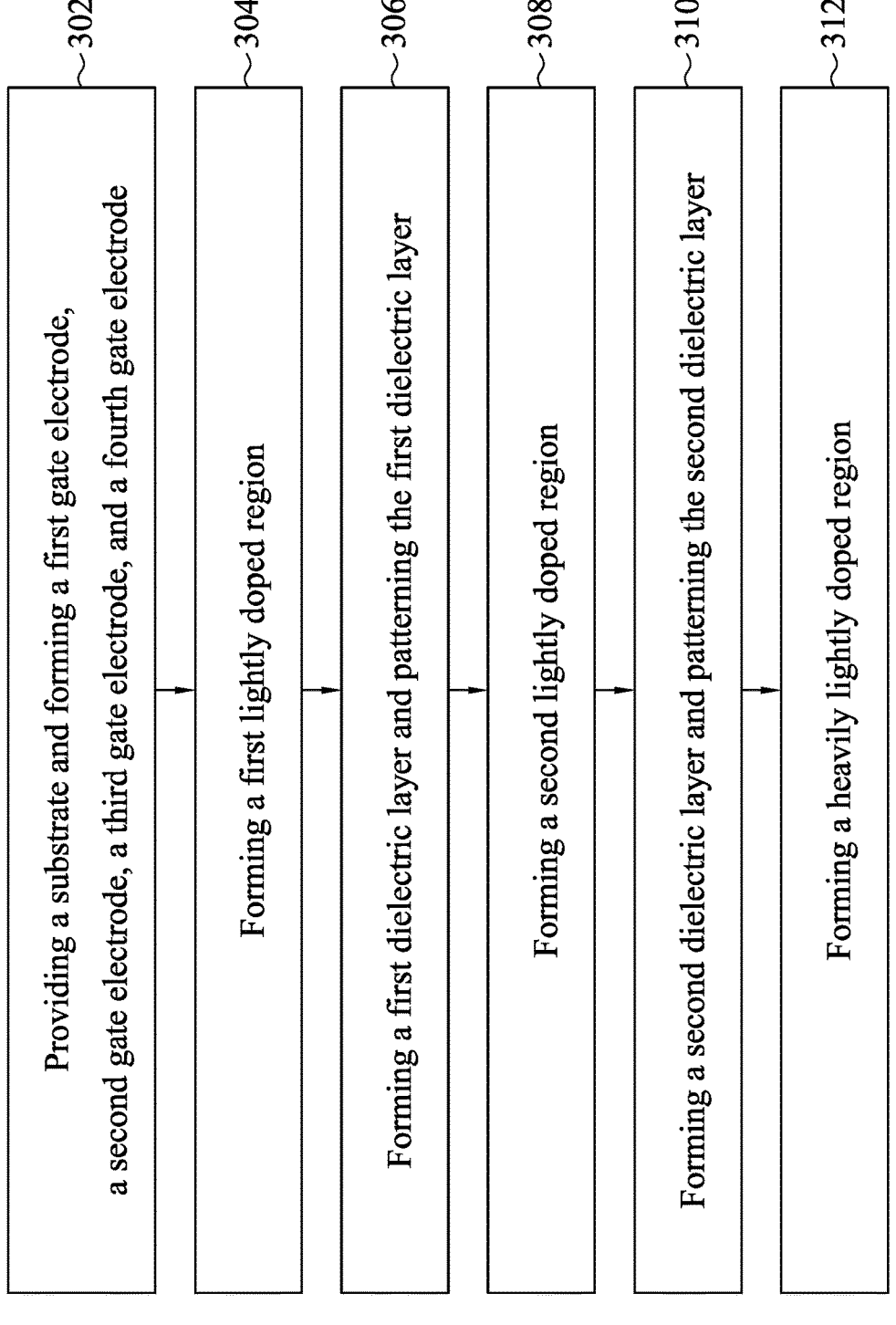
FIG. 7 is a flowchart illustrating a method for preparing a semiconductor device, in accordance with some embodiments of the present disclosure.

FIG. 7 is a flowchart illustrating a method 300 of manufacturing a semiconductor device, in accordance with some embodiments of the present disclosure.

The method 300 may begin with operation 302 in which a substrate is provided. The substrate may have a first region and a second region. A first gate electrode and a second gate electrode may be formed over the first region of the substrate. A third gate electrode and a fourth gate electrode may be formed over the second region of the substrate. A first distance between the first gate electrode and the second gate electrode may be different from a second distance between the third gate electrode and the fourth gate electrode.

The method 300 may continue with operation 304 in which a first lightly doped region is formed within the substrate and between the first gate electrode and the second gate electrode. The first lightly doped region may be formed between the third gate electrode and the fourth gate electrode The method 300 may continue with operation 306 in which a first dielectric layer is formed to cover the first gate electrode, the second electrode, the third gate electrode, the fourth gate electrode, and the substrate. An etching technique is performed to pattern the first dielectric layer. A first spacer may be formed on a sidewall of the first gate electrode. A second spacer may be formed on a sidewall of the second gate electrode. A third spacer may be formed on a sidewall of the third gate electrode. A fourth spacer may be formed on a sidewall of the fourth gate electrode. The substrate may be exposed.

The method 300 may continue with operation 308 in which a second lightly doped region is formed within the substrate and between the first spacer and the second spacer. The second lightly doped region may be formed between the third spacer and the fourth spacer.

The method 300 may continue with operation 310 in which a second dielectric layer is formed to cover the first spacer, the second spacer, the third spacer, the fourth spacer, the first gate electrode, the second electrode, the third electrode, the fourth electrode, and the substrate. An etching technique is performed to pattern the second dielectric layer. A fifth spacer may be formed to cover the first spacer. A sixth spacer may be formed to cover the second spacer. A seventh spacer may be formed to cover the third spacer. An eighth spacer may be formed to cover the fourth spacer. The substrate may be exposed.

The method 300 may continue with operation 312 in which a heavily doped region is formed within the substrate and between the fifth spacer and the sixth spacer. The heavily doped region may be formed between the seventh spacer and the eighth spacer.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 7. In some embodiments, the method 300 can include one or more operations depicted in FIG. 7.

FIG. 8A, FIG. 8B, FIG. 8C, FIG. 8D, FIG. 8E, FIG. 8F, FIG. 8G, FIG. 8H, and FIG. 8I illustrate one or more stages of an exemplary method for manufacturing a semiconductor device according to some embodiments of the present disclosure.

Figure 8A:
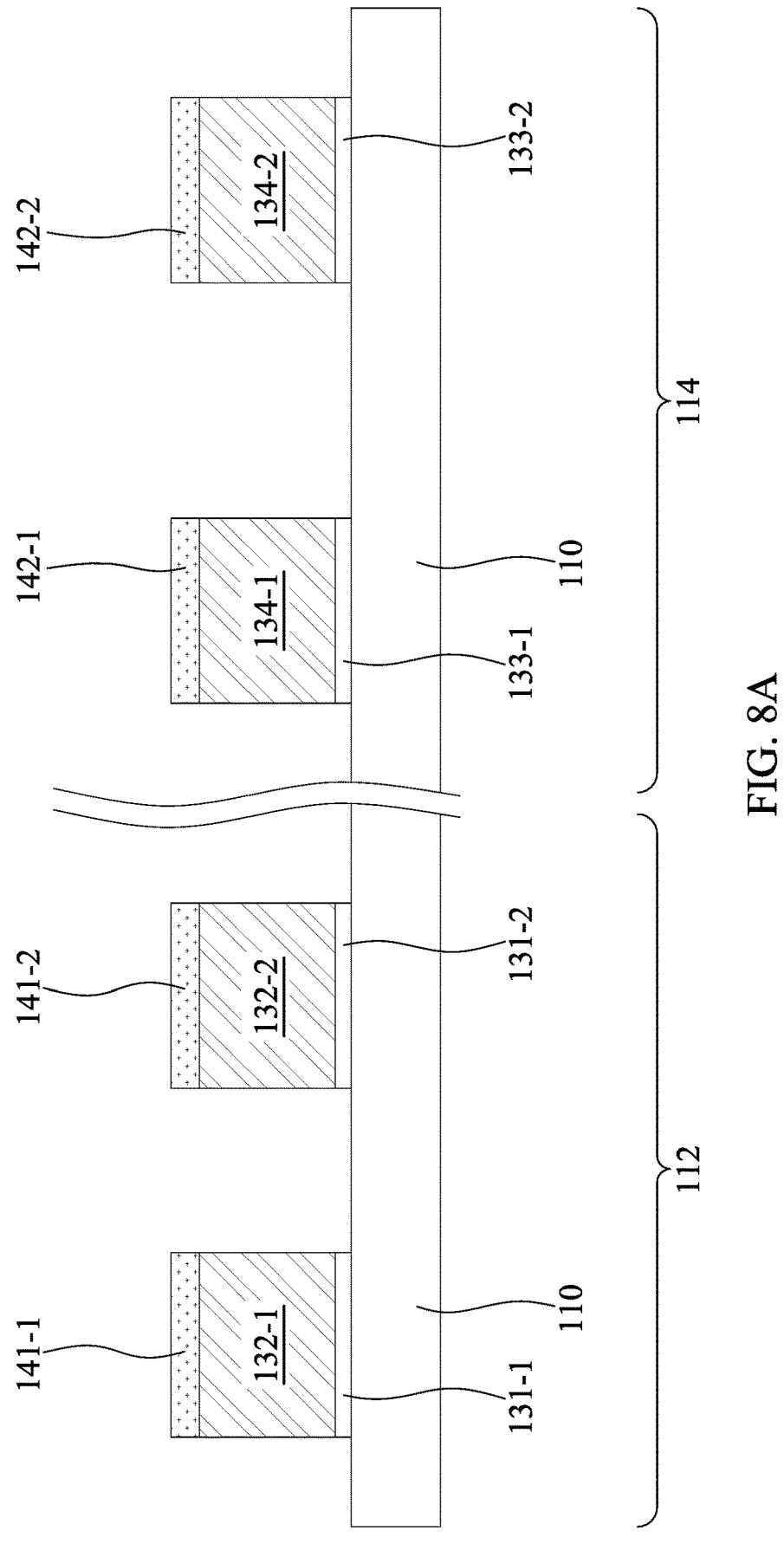
FIG. 8A illustrates one or more stages of an exemplary method for manufacturing a semiconductor device according to some embodiments of the present disclosure.

Referring to FIG. 8A, the substrate 110 may be provided. The substrate 110 may have a region 112 and a region 114. The gate dielectric layers 131-1 and 131-2 may be formed on the region 112 of the substrate 110. The gate dielectric layers 133-1 and 133-2 may be formed on the region 114 of the substrate 110. The gate electrode 132-1 may be formed on the gate dielectric layer 131-1. The gate electrode 132-2 may be formed on the gate dielectric layer 131-2. The gate electrode 134-1 may be formed on the gate dielectric layer 133-1. The gate electrode 134-2 may be formed on the gate dielectric layer 133-2. The mask layer 141-1 may be formed on the gate electrode 132-1. The mask layer 141-2 may be formed on the gate dielectric layer 131-2. The mask layer 142-1 may be formed on the gate electrode 134-1. The mask layer 142-2 may be formed on the gate electrode 134-2.

Figure 8B:
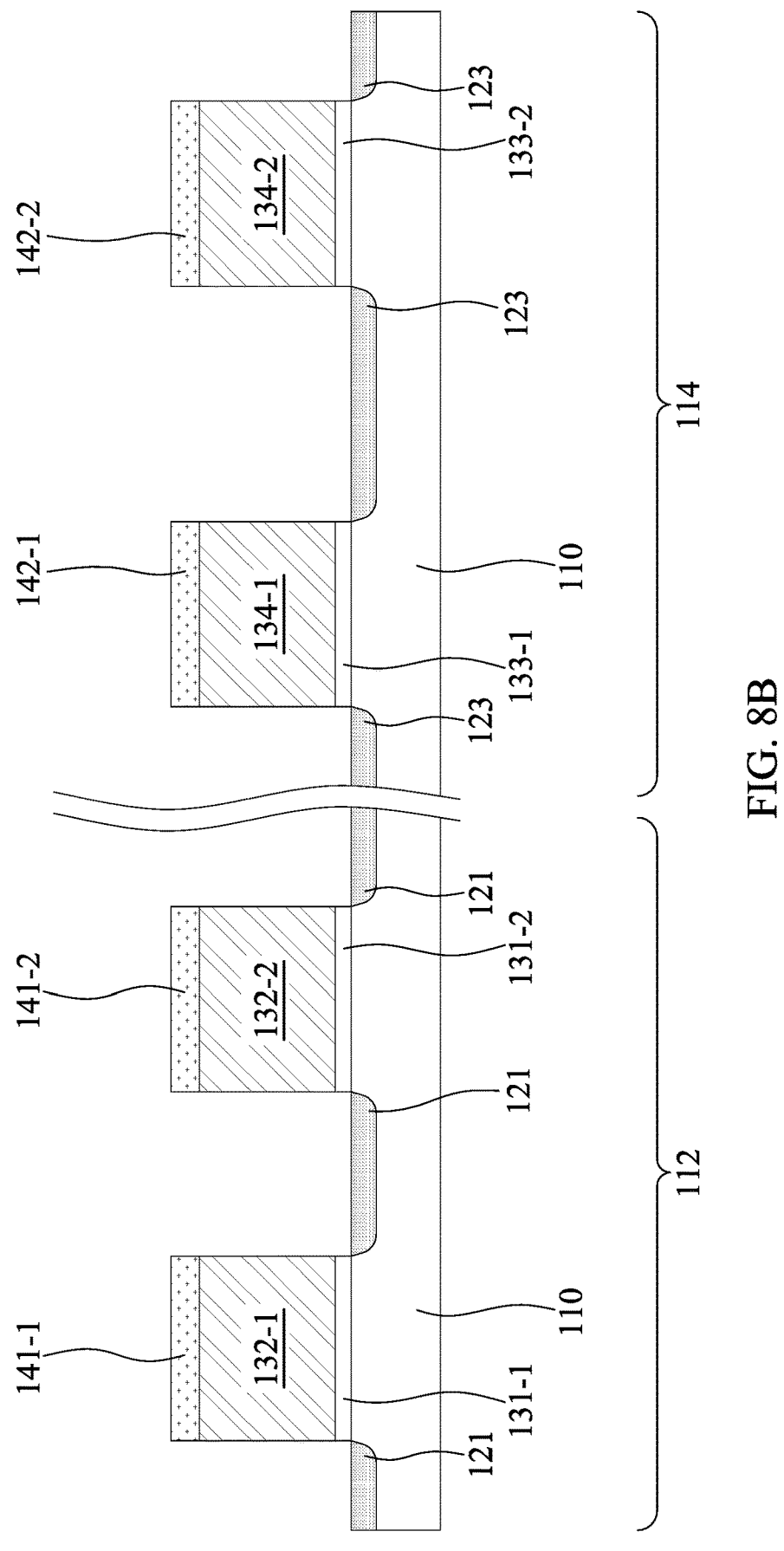
FIG. 8B illustrates one or more stages of an exemplary method for manufacturing a semiconductor device according to some embodiments of the present disclosure.

Referring to FIG. 8B, the lightly doped region 121 may be formed within the substrate 110 and between the gate electrodes 132-1 and 132-2. The lightly doped region 123 may be formed within the substrate 110 and between the gate electrodes 134-1 and 134-2.

Figure 8C:
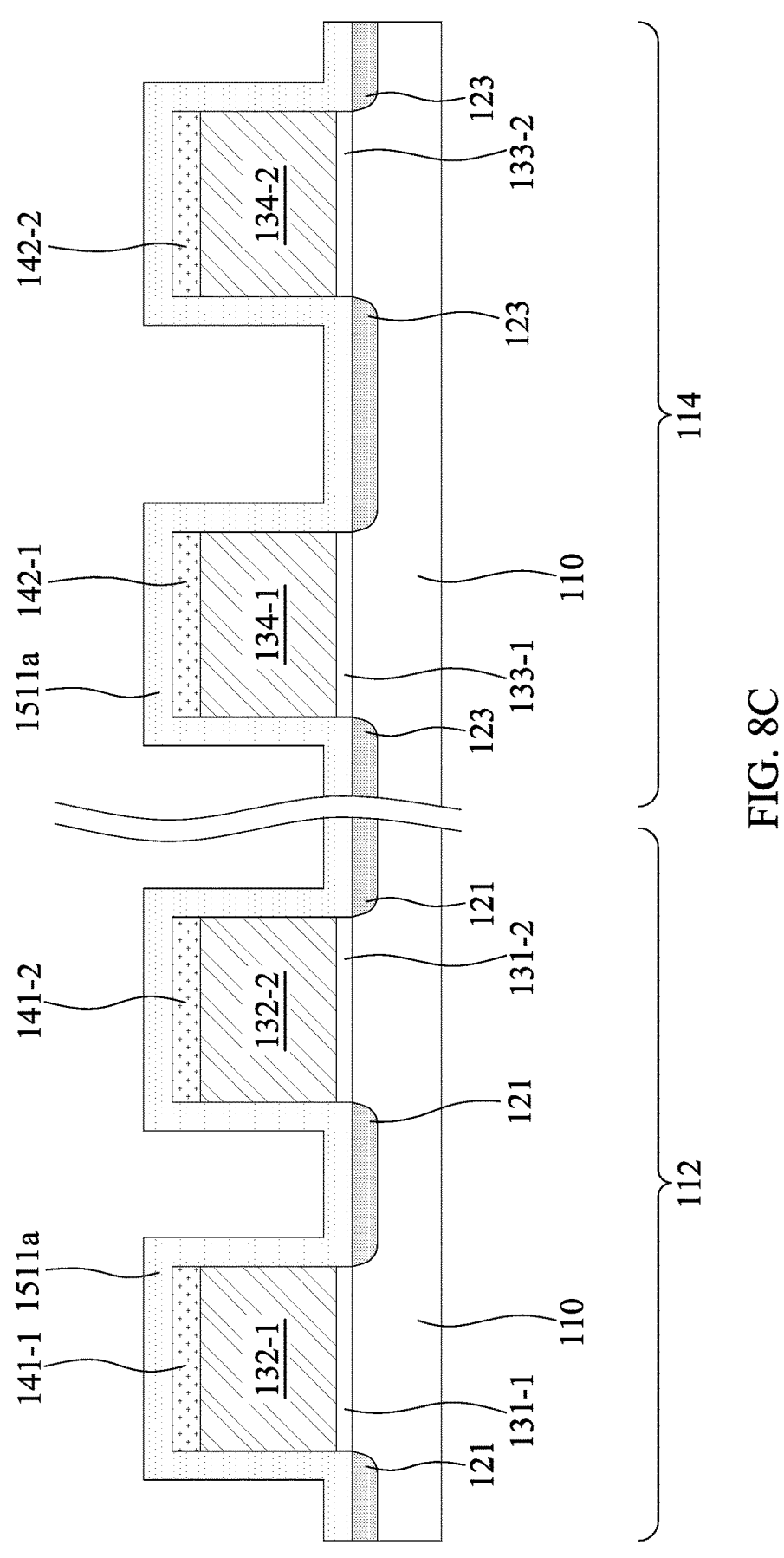
FIG. 8C illustrates one or more stages of an exemplary method for manufacturing a semiconductor device according to some embodiments of the present disclosure.

Referring to FIG. 8C, a dielectric layer 1511*a* may be formed to cover the gate electrodes 132-1, 132-2, 134-1 and 134-2. The dielectric layer 1511*a* may cover the substrate 110. The dielectric layer 1511*a* may be formed by, for example, CVD, ALD, PVD, LPCVD, and PECVD, or other suitable processes.

Figure 8D:
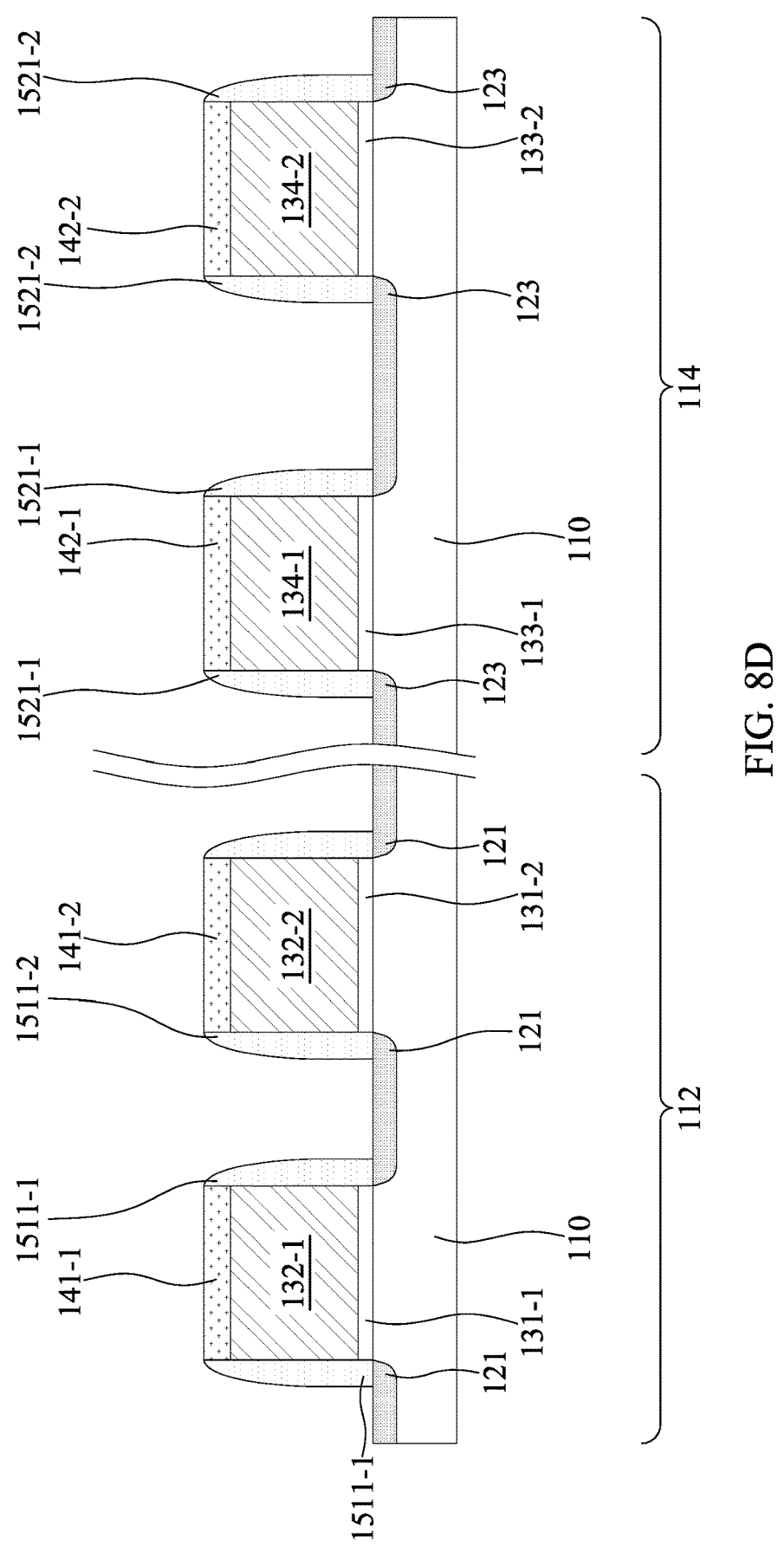
FIG. 8D illustrates one or more stages of an exemplary method for manufacturing a semiconductor device according to some embodiments of the present disclosure.

Referring to FIG. 8D, an etching technique may be performed. The dielectric layer 1511*a* may be patterned to form the spacer 1511-1 on the sidewall of the gate electrode 132-1 and the spacer 1511-2 on the sidewall of the gate electrode 132-2. The spacer 1521-1 may be formed on the sidewall of the gate electrode 134-1. The spacer 1521-2 may be formed on the sidewall of the gate electrode 134-2. The substrate 110 may be exposed.

Figure 8E:
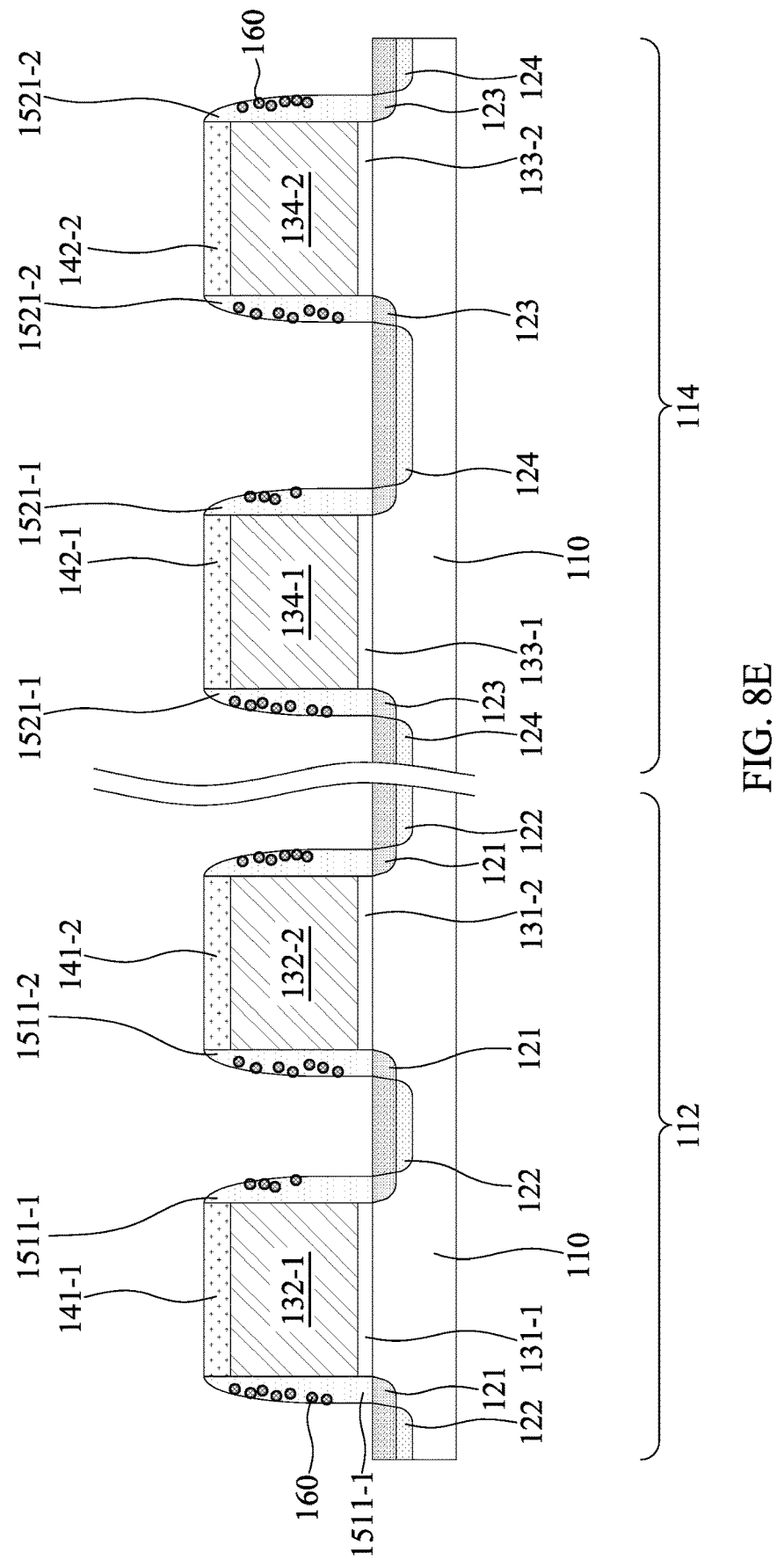
FIG. 8E illustrates one or more stages of an exemplary method for manufacturing a semiconductor device according to some embodiments of the present disclosure.

Referring to FIG. 8E, the lightly doped region 122 may be formed in the substrate 110 and between the spacers 1511-1 and 1511-2. The dopants 160 may be doped into the spacers 1511-1 and 1511-2. The lightly doped region 124 may be formed in the substrate 110 and between the spacers 1521-1 and 1521-2. The dopants 160 may be doped into the spacers 1521-1 and 1521-2. The dopants 160 in the spacer 1521-1 may be the same as that in the spacer 1511-1.

Figure 8F:
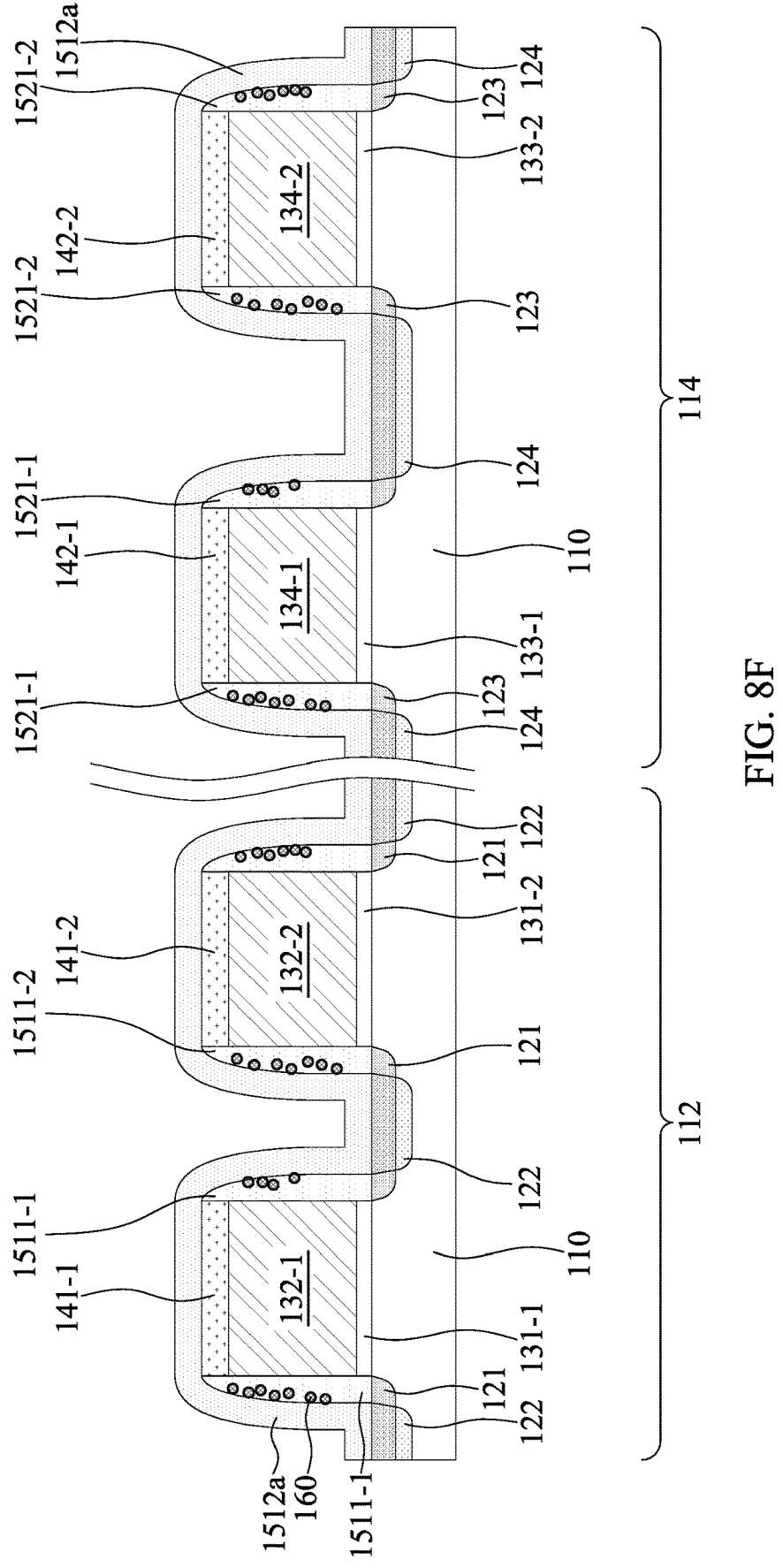
FIG. 8F illustrates one or more stages of an exemplary method for manufacturing a semiconductor device according to some embodiments of the present disclosure.

Referring to FIG. 8F, a dielectric layer 1512*a* may be formed to cover the gate electrodes 132-1, 132-2, 134-1 and 134-2. The dielectric layer 1512*a* may cover the spacers 1511-1, 1511-2, 1512-1 and 1512-2. The dielectric layer 1512*a* may cover the substrate 110. The dielectric layer 1512*a* may be formed by, for example, CVD, ALD, PVD, LPCVD, and PECVD, or other suitable processes.

Figure 8G:
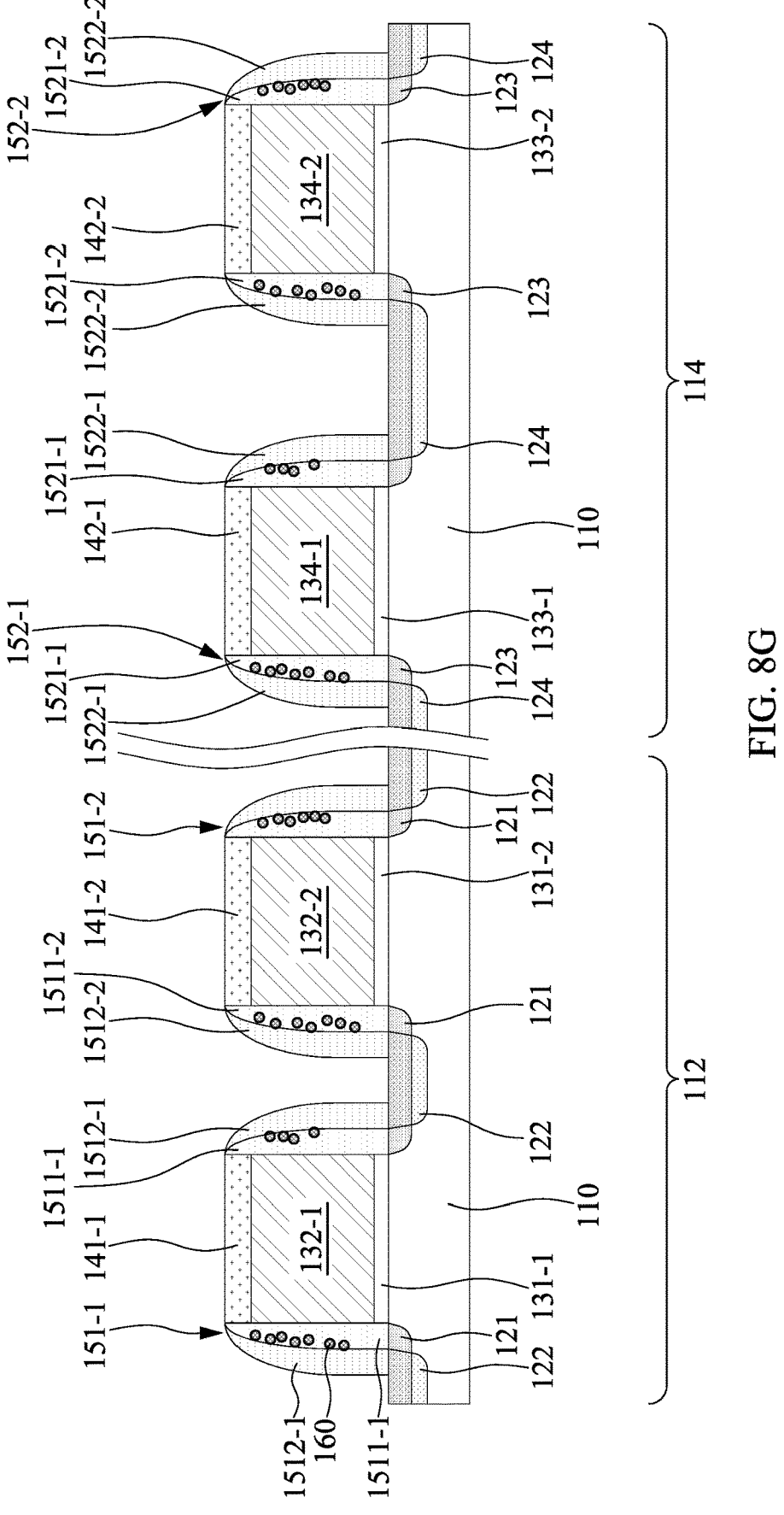
FIG. 8G illustrates one or more stages of an exemplary method for manufacturing a semiconductor device according to some embodiments of the present disclosure.

Referring to FIG. 8G, an etching technique may be performed. The dielectric layer 1512*a* may be patterned to form the spacer 1512-1 on the spacer 1511-1. The spacer 1512-2 may be formed on the spacer 1511-2. The spacer 1522-1 may be formed on the spacer 1521-1. The spacer 1522-2 may be formed on the spacer 1521-2. The substrate 110 may be exposed.

Figure 8H:
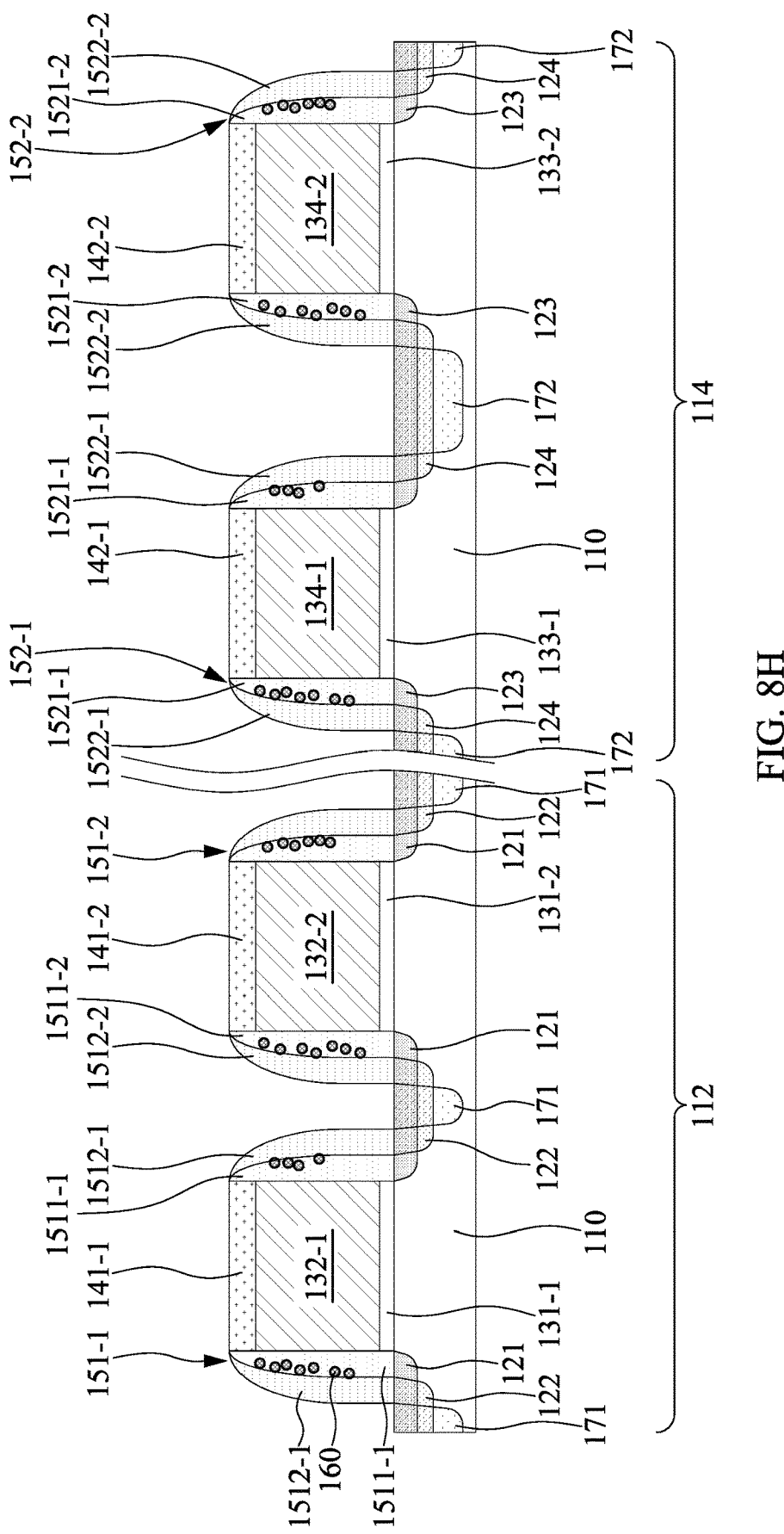
FIG. 8H illustrates one or more stages of an exemplary method for manufacturing a semiconductor device according to some embodiments of the present disclosure.

Referring to FIG. 8H, the heavily doped region 171 may be formed within the substrate 110 and between the spacers 1512-1 and 1512-2. The heavily doped region 172 may be formed within the substrate 110 and between the spacers 1522-1 and 1522-2.

Figure 8I:
FIG. 8I illustrates one or more stages of an exemplary method for manufacturing a semiconductor device according to some embodiments of the present disclosure.

Referring to FIG. 8I, the dielectric structure 180 may be formed to cover the substrate 110. The conductive 191 may be formed to connect the heavily doped region 171. The conductive 192 may be formed to connect the heavily doped region 172. As a result, a semiconductor device, such as the semiconductor device 100*d* as shown in FIG. 4, may be produced.

One aspect of the present disclosure provides a semiconductor device. The semiconductor device includes a substrate, a gate electrode, a first spacer, and a second spacer. The gate electrode is disposed on the substrate. The first spacer is disposed on a sidewall of the gate electrode. The second spacer covers the first spacer. The first spacer includes dopants.

Another aspect of the present disclosure provides a semiconductor device. The semiconductor device includes a substrate, a plurality of first gate electrodes, a first spacer, a first lightly doped region, a second lightly doped region. Each of the plurality of first gate electrodes is disposed on the substrate. The first spacer is disposed on a sidewall of each of the plurality of first gate electrodes. The first lightly doped region is disposed within the substrate and between two of the plurality of first gate electrodes. The second lightly doped region is disposed within the substrate and between two of the plurality of first gate electrodes. The first lightly doped region overlaps the second lightly doped region. The first lightly doped region has a first dimension. The second lightly doped region has a second dimension less than the first dimension along a first direction.

Another aspect of the present disclosure provides a method for manufacturing a semiconductor device. The method includes: providing a substrate; forming a first gate electrode on the substrate; forming a second gate electrode on the substrate and adjacent to the first gate electrode; forming a first dielectric layer covering the first gate electrode and the second gate electrode; patterning the first dielectric layer to form a first spacer on a sidewall of the first gate electrode and a second spacer on a sidewall of the second gate electrode; forming a second dielectric layer covering the first spacer and the second spacer; and patterning the second dielectric layer to form a third spacer covering the first spacer and a fourth spacer covering the second spacer.

The embodiments of the present disclosure provide a method for preparing a semiconductor device. The method includes at least two cycles of depositing dielectric layers and patterning the dielectric layers, which thereby defines multiple spacers. The spacers defined by the first cycle can be used to define a lightly doped region of a different profile. Further, by multiple cycles of forming spacers, the dimension of the entire spacer can be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate;
   a gate electrode disposed on the substrate;
   a first spacer disposed on a sidewall of the gate electrode; and
   a second spacer covering the first spacer,
   wherein the first spacer comprises dopants;
   wherein the dopants are located adjacent to an interface between the first spacer and the second spacer;
   wherein the second spacer has an external surface facing away from the first spacer, and a surface roughness of the interface between the first spacer and the second spacer is greater than a surface roughness of the external surface of the second spacer.

2. The semiconductor device of claim 1, further comprising:

a first lightly doped region disposed within the substrate and adjacent to the gate electrode; and a second lightly doped region disposed within the substrate, wherein a dimension of the first lightly doped region is different from a dimension of the second lightly doped region.

3. The semiconductor device of claim 2, wherein the dimension of the second lightly doped region is determined by a thickness of the first spacer.

4. The semiconductor device of claim 2, wherein a portion of the first spacer is free from vertically overlapping the second lightly doped region.

5. The semiconductor device of claim 2, further comprising:

a heavily doped region disposed within the substrate and adjacent to the second spacer.

6. The semiconductor device of claim 1, further comprising:

a conductive via penetrating the second spacer.

7. The semiconductor device of claim 1, further comprising:

a mask layer covering the gate electrode, wherein the first spacer is disposed on a sidewall of the mask layer.

8. The semiconductor device of claim 1, wherein a material of the first spacer is the same as that of the second spacer.

9. The semiconductor device of claim 1, further comprising:

a spacer protection layer covering the first spacer and the second spacer; and a conductive via spaced apart from the second spacer by the spacer protection layer.

10. A semiconductor device, comprising:

a substrate;

a plurality of first gate electrodes on the substrate;

a first spacer disposed on a sidewall of each of the plurality of first gate electrodes;

a second spacer covering the first spacer, wherein the first spacer comprises a dopant;

a first lightly doped region disposed within the substrate and between two of the plurality of first gate electrodes; and a second lightly doped region disposed within the substrate and between two of the plurality of first gate electrodes, wherein the first lightly doped region overlaps the second lightly doped region, the first lightly doped region has a first dimension, and the second lightly doped region has a second dimension less than the first dimension along a first direction;

wherein the dopant of the first spacer is the same as that of the second lightly doped region.

11. The semiconductor device of claim 10, wherein a material of the second spacer is the same as that of the first spacer.

12. The semiconductor device of claim 10, further comprising:

a heavily doped region disposed within the substrate and overlaps the first lightly doped region and the second lightly doped region.

13. The semiconductor device of claim 12, wherein a third dimension of the heavily doped region is less than the second dimension of the second lightly doped region along the first direction.

14. The semiconductor device of claim 12, further comprising:

a conductive via connected to the heavily doped region, wherein the conductive via is in contact with the second spacer.

15. The semiconductor device of claim 12, further comprising:

a spacer protection layer covering the first spacer and the second spacer; and a conductive via connected to the heavily doped region, wherein the conductive via is separated from the second spacer by the spacer protection layer.

16. The semiconductor device of claim 10, further comprising:

a plurality of second gate electrodes, wherein the plurality of first gate electrodes has a first distance, the plurality of second gate electrodes has a second distance different from the first distance; and a third spacer disposed on a sidewall of each of the plurality of second gate electrodes, wherein the third spacer comprise a dopant;

wherein the dopant in the third spacer is the same as that in the first spacer.

* * * * *